US010127972B2

(12) United States Patent
Kawamura et al.

(10) Patent No.: US 10,127,972 B2
(45) Date of Patent: Nov. 13, 2018

(54) APPARATUSES AND METHODS INCLUDING TWO TRANSISTOR-ONE CAPACITOR MEMORY AND FOR ACCESSING SAME

(71) Applicant: MICRON TECHNOLOGY, INC., Boise, ID (US)

(72) Inventors: Christopher J. Kawamura, Boise, ID (US); Scott J. Derner, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/679,042

(22) Filed: Aug. 16, 2017

(65) Prior Publication Data
US 2018/0061477 A1    Mar. 1, 2018

Related U.S. Application Data

(60) Provisional application No. 62/381,844, filed on Aug. 31, 2016.

(51) Int. Cl.
*G11C 11/24*     (2006.01)
*G11C 11/4091*   (2006.01)
(Continued)

(52) U.S. Cl.
CPC .......... *G11C 11/4091* (2013.01); *G11C 5/025* (2013.01); *G11C 7/06* (2013.01);
(Continued)

(58) Field of Classification Search
CPC ....... G11C 11/4091; G11C 5/025; G11C 7/06; G11C 7/18; G11C 8/16; G11C 11/4096; H01L 27/10897
(Continued)

(56) References Cited

U.S. PATENT DOCUMENTS 4,103,342 A   7/1978 Miersch et al.
5,218,566 A   6/1993 Papaliolios
(Continued)

FOREIGN PATENT DOCUMENTS

WO    201804486 A1    3/2018
WO    2018044485      3/2018
(Continued)

OTHER PUBLICATIONS

International Search Report and Written Opinion dated Nov. 15, 2017 for Application No. PCT/US2017/045756.
(Continued)

*Primary Examiner* — Huan Hoang
(74) *Attorney, Agent, or Firm* — Dorsey & Whitney LLP

(57) ABSTRACT

Apparatuses and methods are disclosed that include two transistor-one capacitor memory and for accessing such memory. An example apparatus includes a capacitor coupled to first and second selection components. The apparatus further includes a first digit line and the first selection component configured to couple a first plate of the capacitor to the first digit line, and also includes a second digit line and the second selection component configured to couple the second plate to the second digit line. A sense amplifier is coupled to the second digit line and is configured to amplify a voltage difference between a voltage coupled to the second digit line and the reference voltage.

8 Claims, 13 Drawing Sheets

(51) Int. Cl.

| | | |
|---|---|---|
| *G11C 5/02* | (2006.01) | |
| *G11C 7/06* | (2006.01) | |
| *G11C 7/18* | (2006.01) | |
| *G11C 8/16* | (2006.01) | |
| *G11C 11/4096* | (2006.01) | |
| *G11C 11/403* | (2006.01) | |
| *G11C 11/4094* | (2006.01) | |
| *G11C 11/4097* | (2006.01) | |
| *H01L 27/108* | (2006.01) | |

(52) U.S. Cl.
CPC ............... *G11C 7/062* (2013.01); *G11C 7/18* (2013.01); *G11C 8/16* (2013.01); *G11C 11/403* (2013.01); *G11C 11/4094* (2013.01); *G11C 11/4096* (2013.01); *G11C 11/4097* (2013.01); *H01L 27/108* (2013.01); *G11C 2211/4013* (2013.01); *H01L 27/10897* (2013.01)

(58) Field of Classification Search
USPC ........................................................ 365/149
See application file for complete search history.

(56) References Cited

U.S. PATENT DOCUMENTS

| | | | |
|---|---|---|---|
| 5,241,503 A | | 8/1993 | Cheng |
| 5,373,463 A | * | 12/1994 | Jones, Jr. ................ G11C 11/22 365/145 |
| 5,381,364 A | | 1/1995 | Chern et al. |
| 5,539,279 A | | 7/1996 | Takeuchi et al. |
| 5,598,366 A | | 1/1997 | Kraus et al. |
| 5,617,349 A | | 4/1997 | Koike |
| 5,675,530 A | | 10/1997 | Hirano et al. |
| 5,798,964 A | | 8/1998 | Shimizu et al. |
| 5,889,696 A | | 3/1999 | Kawakubo et al. |
| 5,912,846 A | | 6/1999 | Taylor |
| 5,917,746 A | | 6/1999 | Seyyedy |
| 5,959,922 A | | 9/1999 | Jung |
| 6,034,884 A | | 3/2000 | Jung |
| 6,038,160 A | | 3/2000 | Nakane et al. |
| 6,147,895 A | | 11/2000 | Kamp |
| 6,154,387 A | | 11/2000 | Takata |
| 6,198,654 B1 | | 3/2001 | Ashikaga |
| 6,229,730 B1 | | 5/2001 | Kato |
| 6,363,002 B1 | | 3/2002 | Nishimura et al. |
| 6,483,737 B2 | | 11/2002 | Takeuchi et al. |
| 6,538,914 B1 | | 3/2003 | Chung |
| 6,687,151 B2 | | 2/2004 | Endo et al. |
| 6,807,082 B2 | | 10/2004 | Aoki et al. |
| 6,961,271 B2 | | 11/2005 | Jeon et al. |
| 2002/0044477 A1 | | 4/2002 | Takeuchi et al. |
| 2003/0173604 A1 | | 9/2003 | Aoki et al. |
| 2004/0119105 A1 | | 6/2004 | Wilson |
| 2005/0012125 A1 | | 1/2005 | Summerfelt et al. |
| 2005/0012130 A1 | | 1/2005 | Forbes |
| 2005/0122763 A1 | | 6/2005 | Yamamura |
| 2005/0146918 A1 | | 7/2005 | Ogiwara et al. |
| 2006/0215472 A1 | | 9/2006 | Yoon et al. |
| 2006/0221746 A1 | | 10/2006 | Kang et al. |
| 2006/0285378 A1 | * | 12/2006 | Yamaoka ................ G11C 11/22 365/145 |
| 2008/0265300 A1 | | 10/2008 | Akiyama et al. |
| 2009/0010037 A1 | | 1/2009 | Kang et al. |
| 2010/0165704 A1 | | 7/2010 | Wu et al. |
| 2011/0199811 A1 | * | 8/2011 | Kanno ..................... G11C 8/10 365/148 |
| 2012/0074466 A1 | | 3/2012 | Setiadi et al. |
| 2012/0170348 A1 | | 7/2012 | Clinton et al. |
| 2012/0307545 A1 | | 12/2012 | McAdams et al. |
| 2013/0094274 A1 | | 4/2013 | Kaneko |
| 2014/0036567 A1 | * | 2/2014 | Fukuzumi ................ G11C 5/02 365/63 |
| 2018/0061468 A1 | | 3/2018 | Derner et al. |
| 2018/0061469 A1 | | 3/2018 | Derner et al. |
| 2018/0061471 A1 | | 3/2018 | Kawamura et al. |

FOREIGN PATENT DOCUMENTS

| | | |
|---|---|---|
| WO | 2018044487 | 3/2018 |
| WO | 2018044510 | 3/2018 |

OTHER PUBLICATIONS

U.S. Appl. No. 15/678,978, entitled "Ferroelectric Memory Cells", filed on Aug. 16, 2017.
U.S. Appl. No. 15/679,016, entitled "Apparatuses and Methods Including Ferroelectric Memory and for Operating Ferroelectric Memory", filed on Aug. 16, 2017.
U.S. Appl. No. 15/679,032, entitled "Apparatuses and Methods Including Ferroelectric Memory and for Accessing Ferroelectric Memory", filed on Aug. 16, 2017.
Henkels, W.H. et al., "Large-Signal 2T, 1C DRAM Cell: Signal and Layout Analysis", IEEE Journal of Solid-State Circuits, vol. 29, No. 7, Jul. 1994, 4 pages.
U.S. Appl. No. 16/005,493, titled "Apparatuses and Methods for Memory Including Ferroelectric Memory Cells and Dielectric Memory Cells", filed Jun. 11, 2018, pp. all.
First Office Action for TW Application No. 106128514, dated Jul. 24, 2018, pp. all.
U.S. Appl. No. 16/058,202 titled "Apparatuses and Methods Including Ferroelectric Memory and for Operating Ferroelectric Memory" filed Aug. 8, 2018, pp. all.
U.S. Appl. No. 16/131,969, titled "Apparatuses and Methods Including Ferroelectric Memory and for Accessing Ferroelectric Memory", filed on Sep. 14, 2018, pp. all.
U.S. Appl. No. 16/104,709 titled "Ferroelectric Memory Cells", filed Aug. 17, 2018, pp. all.
U.S. Appl. No. 16/105,631 titled "Apparatuses and Methods Including Two Transistor-One Capacitor Memory and for Accessing Same", filed Aug. 20, 2018, pp. all.

* cited by examiner

APPARATUSES AND METHODS INCLUDING TWO TRANSISTOR-ONE CAPACITOR MEMORY AND FOR ACCESSING SAME

CROSS-REFERENCE TO RELATED APPLICATION

This application claims the filing benefit of U.S. Provisional Application No. 62/381,844, filed Aug. 31, 2016. This application is incorporated by reference herein in its entirety and for all purposes.

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. While features of non-volatile memory, such as the ability to store data without periodic refreshing, may be advantageous, certain features of volatile memory may offer performance advantages, such as faster read or write speeds.

DETAILED DESCRIPTION

Figure 1:
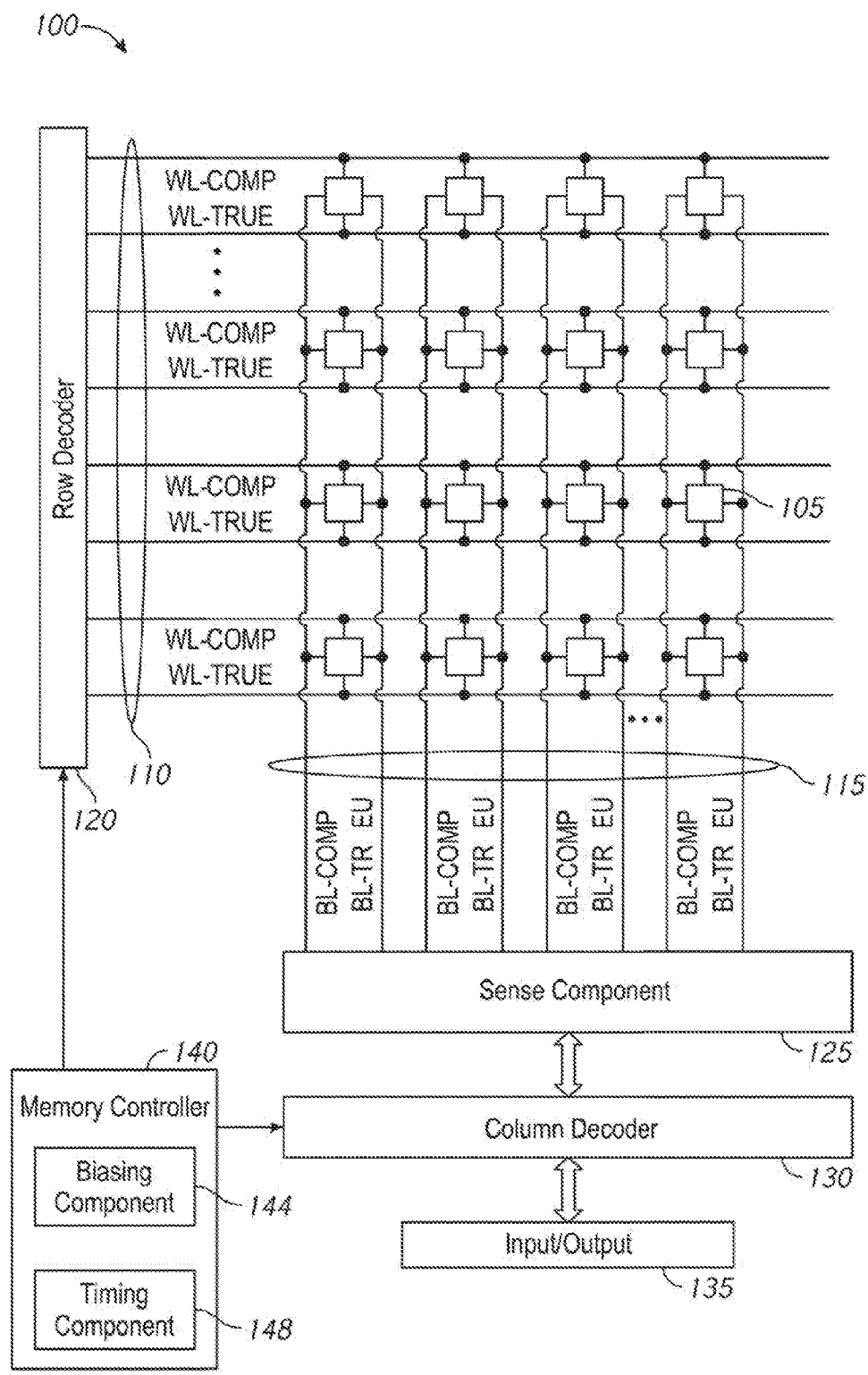
FIG. 1 illustrates an example memory array that supports vertically stacked memory cells in accordance with an embodiment of the present disclosure.

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

A memory cell can be vertically stacked as part of an integrated circuit architecture. For example, an example memory cell of a vertically stack configuration may be referred to as 2T-1C, where each capacitor plate of a capacitor is coupled to a source/drain region of a respective transistor. Vertically stacking memory cells may have beneficial properties that may result in improved performance relative to other memory architectures; for example, improving refresh timing and faster write times to memory cell, relative to the respective refresh timing and write times of a traditional memory cell that is placed on a memory array parallel to CMOS circuitry. In addition, a memory state can be determined based on a comparison of the respective digit lines at the top and bottom of the vertically stacked memory cell. However, the vertical stacking of memory cells can introduce structural difficulties when incorporating such vertically stacked memory cells into integrated circuit architectures.

A vertical configuration can introduce structural difficulties such as coupling the memory cell to various connection nodes of the memory cell. For example, increased connections may be necessary to support a vertically stacked memory cell having a connection at the top that is to be connected to a connection at the bottom of the vertically stacked memory cell. A digit line at the top of a vertically stacked memory cell may require a connection to a sense amplifier connected at the bottom of the vertically stacked memory cell (e.g., a lower digit line). A vertical line being routed from the top of the vertically stacked memory cell to the bottom may introduce other issues when incorporating that circuitry into an integrated circuit; for example, the vertical line may introduce electrical leakage of a signal applied on that vertical line or it may introduce other noise elements to the memory cell circuitry. Embodiments described in the present disclosure eliminate the need to utilize such vertical lines. As will be described herein, a reference voltage applied to an upper digit line can be provided during activation of a sense amplifier during a read operation of a vertically stacked memory cell. As such, the embodiments described herein need not utilize vertical lines connecting the top of a vertically stacked memory cell to a connection at the bottom of the memory cell.

FIG. 1 illustrates an example memory array 100 that supports vertically stacked memory cells in accordance with an embodiment of the present disclosure. Memory array 100 may also be referred to as an electronic memory apparatus. Memory array 100 includes memory cells 105 that are configured to store different states. Each memory cell 105 may be configured to store two states, denoted as a logic 0 and a logic 1. In some cases, memory cell 105 is configured to store more than two logic states. A memory cell 105 may include a capacitor to store a charge representative of the different states. For example, a charged and uncharged capacitor may represent two logic states, respectively.

Operations such as reading and writing may be performed on memory cells 105 by activating or selecting the appropriate access lines 110 and digit lines 115. Access lines 110 may also be referred to as word lines 110. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, doped semiconductors, other conductive materials, or the like. According to the example of FIG. 1, each row of memory cells 105 is coupled to word lines 110 WL-COMP and WL-TRUE, and each column of memory cells 105 is coupled to digit lines 115 BL-COMP and BL-TRUE. It should be noted that word lines WL-COMP and WL-TRUE do not mean the so-called true and complementary word lines that takes complementary levels or states to each other, but merely indicates a pair of word lines throughout the disclosure. As will be apparent form the descriptions below, the word lines WL-COMP and WL-TRUE are indeed driven independently of each other. Similarly, digit lines BL-COMP and BL-TRUE merely means a pair of digit lines throughout the disclosure that may take individual levels or states different from each other.

By activating the respective word lines 110 and digit lines 115 (e.g., applying a voltage to the word lines 110 or digit lines 115), a memory cell 105 may be accessed at their intersection. Accessing the memory cell 105 may include reading or writing the memory cell 105. The intersection of a word lines 110 and digit lines 115 may be referred to as an address of a memory cell.

In some architectures, the logic storing device of a cell, e.g., a capacitor, may be electrically isolated from the digit lines by selection components. A word line 110 may be coupled to and may control a respective selection component. For example, the selection component may be a transistor and the word line 110 may be coupled to the gate of the transistor. Activating the word line 110 results in a coupling or closed circuit between the capacitor of a memory cell 105 and corresponding digit line 115. The digit lines may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word lines 110 based on the received row address. Similarly, a column decoder 130 receives a column address from the memory controller 140 and activates the appropriate digit lines 115. For example, memory array 100 may include multiple word lines 110, and multiple digit lines 115. Thus, by activating word lines 110 WL-COMP and WL-TRUE and digit lines 115 BL-COMP and BL-TRUE, the memory cell 105 at their intersection may be accessed.

Upon accessing, a memory cell 105 may be read, or sensed, by sense component 125 to determine the stored state of the memory cell 105. For example, after accessing the memory cell 105, the capacitor of memory cell 105 may discharge onto corresponding digit lines 115. Discharging the capacitor may be based on biasing, or applying a voltage, to the word lines to couple the capacitor to the digit lines. For example, a memory cell 105 may be coupled to a digit line BL-COMP, to which a reference voltage applied. The coupling of the capacitor to the digit line BL-COMP can cause the capacitor to discharge, which causes a change in voltage to the digit line BL-TRUE. As such, the discharging may cause a change in the voltage of the digit line BL-TRUE 115, which sense component 125 may compare to a reference voltage (not shown) in order to determine the stored state of the memory cell 105. For example, if the digit line BL-TRUE 115 has a higher voltage than the reference voltage, then sense component 125 may determine that the stored state in memory cell 105 is a logic 1 and vice versa. Sense component 125 may include various transistors or amplifiers in order to detect and amplify a difference in the signals, which may be referred to as latching. The detected logic state of memory cell 105 may then be output through column decoder 130 as output 135. The above processes will be discussed in more detail later.

A memory cell 105 may be written by activating the relevant word lines 110 and digit lines 115. As discussed above, activating word lines 110 couples the corresponding row of memory cells 105 to their respective digit lines 115. By controlling the relevant digit lines 115 while the word lines 110 are activated, a memory cell 105 may be written— e.g., a logic value may be stored in the memory cell 105. Column decoder 130 may accept data, for example input 135, to be written to the memory cells 105. A memory cell 105 may be written by applying a voltage across the capacitor. This process is discussed in more detail later.

In some memory architectures, accessing the memory cell 105 may degrade or destroy the stored state, and restore operations may be performed to return the original stored state to memory cell 105. For example, the capacitor may be partially or completely discharged during a sense operation, corrupting the stored state. So the stored state may be re-written after a sense operation. Additionally, activating word lines 110 may result in the discharge of all memory cells in the row. Thus, several or all memory cells 105 in the row may need to be restored.

The memory controller 140 may control the operation (e.g., read, write, restore, etc.) of memory cells 105 through the various components, such as row decoder 120, column decoder 130, and sense component 125. Memory controller 140 may generate row and column address signals in order to activate the desired word lines 110 and digit lines 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one or multiple memory cells 105 within memory array 100 may be accessed simultaneously. For example, multiple memory cells of memory array 100 may be accessed simultaneously when a word line to which the multiple memory cells are coupled is activated.

Memory controller 140 may include biasing component 144 and timing component 148, and may operate memory array 100 as described in FIG. 1. Memory controller 140 may be in electronic communication with word lines 110, digit lines 115, and sense component 125. Memory controller 140 may provide a reference voltage VREF to the sense component 125. The components of memory array 100 may be in electronic communication with each other and may perform the functions that will be described in more detail later.

In some cases, memory controller 140 may perform its operations using timing component 148. For example, timing component 148 may control the timing of the various word line selections or biasing, including timing for switching and voltage application to perform the memory functions, such as reading and writing, discussed herein. In some cases, timing component 148 may control the operations of biasing component 144.

Memory controller 140 may be configured to activate word lines 110 or digit lines 115 by applying voltages to the word and digit lines. For example, biasing component 144 may be configured to apply a voltage to operate memory cell 105 to read or write memory cell 105 as described further later. Biasing component 144 may also provide a reference voltage VREF to sense component 125. Additionally, biasing component 144 may provide voltage potentials for the operation of sense component 125.

Sense component 125 may compare a signal from memory cell 105 (through digit line 115) with a reference voltage VREF. The reference voltage VREF may have a value between the two sense voltages, as described later. Upon determining the stored state, the sense component 125 may latch the output, where it may be used in accordance with the operations of an electronic device that memory array 100 is a part.

The components of memory controller 140 and memory array 100 may be made up of circuitry designed to carry out their functions. This may include various circuit elements, for example, conductive lines, transistors, capacitors, inductors, resistors, amplifiers, or other active or inactive elements, configured to carry out the functions described herein.

Figure 2:
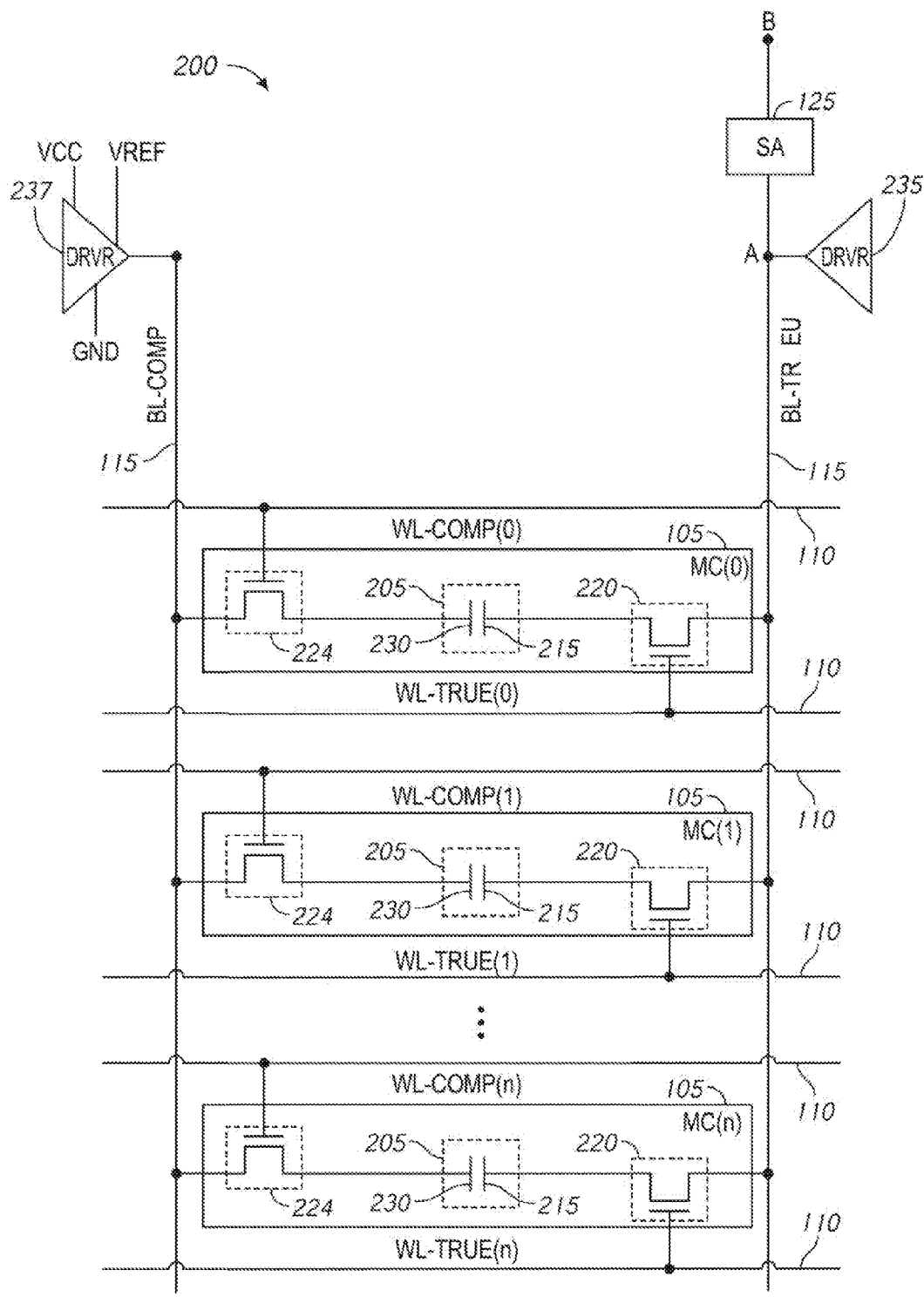
FIG. 2 is a schematic diagram of an example circuit that includes a column of memory cells according to an embodiment of the present disclosure.

FIG. 2 illustrates an example circuit 200 that includes a column of memory cells according to an embodiment of the present disclosure. FIG. 2 illustrates an example circuit 200 that includes memory cells 105 in accordance with various embodiments of the present disclosure. Circuit 200 includes memory cells 105 MC(0)-MC(n), where "n" depends on the array size. The circuit 200 further includes word lines WL-COMP(0)-WL-COMP(n) and WL-TRUE(0)-WL-TRUE(n), digit lines BL-COMP and BL-TRUE, and sense component 125. The word lines, digit lines, and sense component may be examples of memory cells 105, word lines 110, digit lines 115, and sense component 125, respectively, as described with reference to FIG. 1. While one column of memory cells 105 is shown in FIG. 2, a memory array may include a plurality of columns of memory cells as those shown.

Memory cells 105 may include a logic storage component, such as capacitor 205 that has a first plate 230 and a second plate 215. First plate 230 and second plate 215 may be capacitively coupled through a dielectric material positioned between them. The orientation of the first plate 230 and the second plate 215 may be flipped without changing the operation of memory cell 105. The memory cells 105 may further include selection components 220 and 224. The selection components 220 and 224 may be transistors, for example, n-type field effect transistors. In such an example, each of the memory cells 105 includes two transistors and one capacitor.

Circuit 200 also includes driver circuit 235 coupled to sense node A of the sense component 125 (and thus to digit line BL-TRUE), and driver circuit 237 coupled to digit line BL-COMP. Driver circuit 235 can output a range of voltages to the digit line BL-TRUE, and thus to the same voltage to its sense node A. Sense component 125 can be a sense amplifier "SA". The driver 237 can drive the voltage of the digit line BL-COMP to a supply voltage, VCC; to ground; or to a reference voltage VREF that is a half of the supply voltage or ½ VCC. In some embodiments, these voltages may be referred to as sense voltages for a high and low logic states. For example, a VCC voltage may correspond to a high logic state, while a GND voltage may correspond to a low logic state; or vice versa.

Memory cells 105 may be in electronic communication with sense component 125 through digit line BL-COMP and digit line BL-TRUE. In the example of FIG. 2, first plates 230 may be accessed via digit line BL-COMP and second plates 215 may be accessed via digit line BL-TRUE. As described above, various states may be stored by charging or discharging capacitor 205.

The stored state of capacitor 205 may be read or sensed by operating various elements represented in circuit 200. Capacitor 205 may be in electronic communication with digit lines BL-TRUE and BL-COMP. For example, capacitor 205 can be isolated from digit lines BL-TRUE and BL-COMP when selection components 220 and 224 are deactivated, and capacitor 205 can be coupled to digit lines BL-TRUE and BL-COMP when selection components 220 and 224 are activated. Activating selection components 220 and 224 may be referred to as selecting memory cell 105. In some cases, selection components 220 and 224 are transistors and the operation is controlled by applying voltages to the transistor gates, where the voltage magnitude is greater than the threshold voltage of the transistors. Word line WL-TRUE may activate selection component 220 and word line WL-COMP may activate selection component 224. For example, a voltage applied to word line WL-TRUE is applied to the transistor gate of selection component 220 and a voltage applied to word line WL-COMP is applied to the transistor gate of selection component 224. As a result, the respective capacitor 205 is coupled with digit lines BL-TRUE and BL-COMP, respectively. The memory cell 105 may be considered in storage mode when both word lines WL-TRUE and WL-COMP are deactivated.

Word lines WL-TRUE(0)-WL-TRUE(n) and WL-COMP(0)-WL-COMP(n) are in electronic communication with selection components 220 and 224 of memory cells 105 MC(0)-MC(n), respectively. Thus, activating word lines WL-TRUE and WL-COMP of a respective memory cell 105 may activate the memory cell 105. For example, activating WL-TRUE(0) and WL-COMP(0) activates memory cell MC(0), activating WL-TRUE(1) and WL-COMP(1) activates memory cell MC(1), and so on. In some examples, the positions of selection components 220 and 224 may be switched, such that selection component 220 is coupled between digit line BL-COMP and first plate 230, and the selection component 224 is coupled between digit line BL-TRUE and second plate 215.

To sense the stored state of the capacitor 205, a reference voltage (e.g., VREF) may be provided to the digit line BL-COMP, for example, by driver circuit 237, and word lines WL-TRUE and WL-COMP may be biased to select a respective memory cell 105. Biasing the word lines WL-TRUE and WL-COMP couples a plate of the capacitor 205 to a respective digit line. Coupling the plate to the respective digit line may change the charge stored by the capacitor 205. The change in stored charge may depend on the initial stored state of each capacitor 205—e.g., whether the initial state stored a logic 1 or a logic 0. A change in the charge of a plate of the capacitor may cause a change in voltage at that plate. The change in the voltage may be coupled across the capacitor 205 to cause a voltage change at the other plate. For example, a change in voltage at the first plate 230 may be coupled across the capacitor 205 to cause a voltage change on the second plate 215. When the selection component 220 is activated by the word line WL-TRUE, the change in voltage of the second plate 215 may cause a change in the voltage of digit line BL-TRUE. The resulting voltage of digit line BL-TRUE may be compared to the reference voltage (e.g., the same reference voltage VREF provided to the digit line BL-COMP and supplied to the sense node B of the sense amplifier 125) by the sense component 125 in order to determine the stored state in each memory cell 105.

Sense component 125 may include various transistors or amplifiers to detect and amplify a difference in signals, which may be referred to as latching. Sense component 125 may include a sense amplifier that receives and compares the voltage of digit line BL-TRUE at node A with the reference voltage VREF at node B and changes in that voltage (e.g., an increase or decrease relative to the reference voltage VREF). The sense amplifier output may drive a sense node A, and the digit line BL-TRUE to a higher (e.g., a positive) or lower (e.g., negative or ground) supply voltage based on the comparison. For instance, if digit line BL-TRUE has a higher voltage than the reference voltage VREF, then the sense amplifier output may drive the sense node A and digit line BL-TRUE to a positive supply voltage. Sense component 125 may then latch the output of the sense amplifier and/or the voltage of digit line BL-TRUE, which may be used to determine the stored state in memory cell 105, e.g., logic 0. Alternatively, if digit line BL-TRUE has a lower voltage than the reference voltage VREF, the sense amplifier output may drive the sense node A and digit line BL-TRUE to a negative or ground voltage. Sense component 125 may similarly latch the sense amplifier output to determine the stored state in memory cell 105, e.g., logic 1. The latched logic state of memory cell 105 may then be output, for example, through column decoder 130 as output 135 with reference to FIG. 1.

To restore the logical state after a read operation on the memory cell 105, the digit line BL-TRUE may be driven to the reference voltage VREF by driver 235. As further described below, along with deactivating the word lines WL-TRUE, WL-COMP at particular times, the initial logic state of the capacitor can be restored to the first plate 230 as the capacitor 205 couples the driven reference voltage from digit line BL-TRUE to the first plate 230 via the second plate 215. During such a restore, the driver 237 may maintain biasing the reference voltage VREF on the digit line BL-COMP. Accordingly, operations of the drivers 235, 237 can be used to restore states to the capacitor 205.

To write memory cell 105, a voltage may be applied across capacitor 205. Various methods may be used. In some examples, selection components 220 and 224 may be activated through word lines WL-TRUE and WL-COMP, respectively, in order to couple capacitor 205 to digit lines BL-TRUE and BL-COMP. For a capacitor 205, a voltage may be applied across capacitor 205 by controlling the voltage of first plate 230 (through digit line BL-COMP) and second plate 215 (through digit line BL-TRUE) to apply a positive or negative voltage across the capacitor 205. In embodiments, for data writing, the write driver 237 may drive the digit line BL-COMP to the supply voltage VCC or the ground voltage depending on data to be written, and the driver 235 may drive the digit line BL-TRUE to the reference voltage VREF, which will be described later in more detail.

In various implementations, the selection components 224, 220 of FIG. 2 can be transistors such that the memory cells 105 may be referred to as 2T 1C configurations. Such a configuration may be utilized in DRAM (dynamic random access memory) and/or other types of memory.

Figure 3:
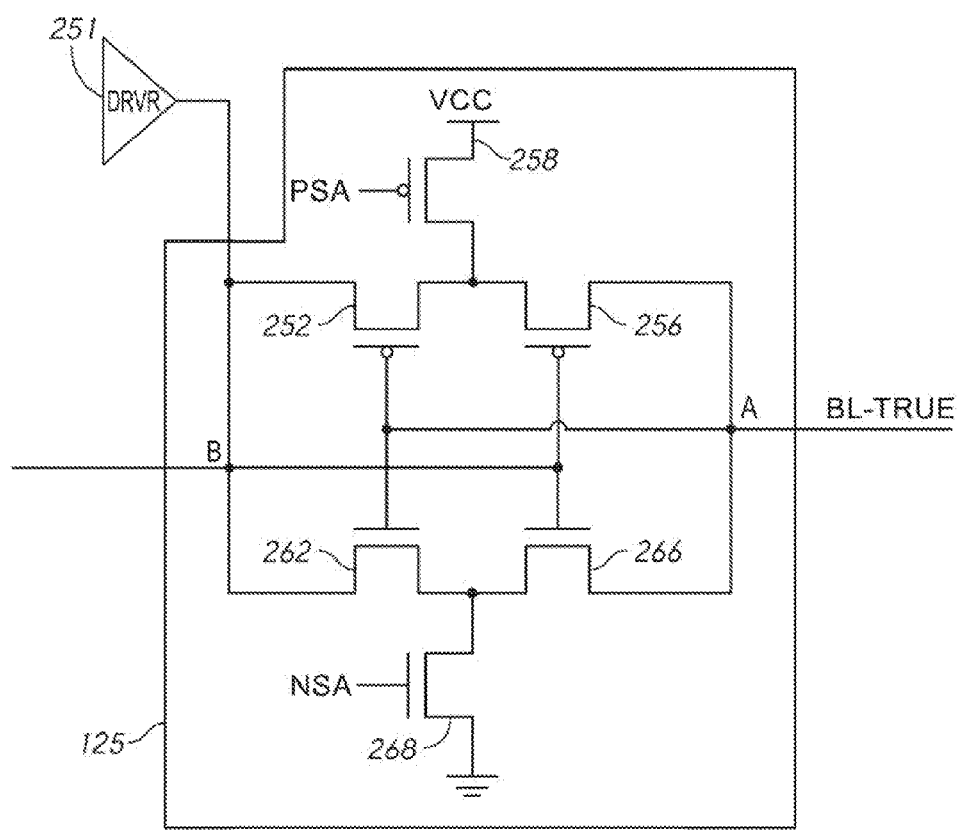
FIG. 3 is a schematic diagram of a sense component according to an embodiment of the disclosure.

FIG. 3 illustrates a sense component 125 according to an embodiment of the disclosure. The sense component 125 includes p-type field effect transistors 252 and 256 and n-type field effect transistors 262 and 266. Gates of the transistor 252 and transistor 262 are coupled to sense node A. Gates of the transistor 256 and transistor 266 are coupled to sense node B. The transistors 252 and 256 and the transistors 262 and 266 represent a sense amplifier. A p-type field effect transistor 258 is configured to be coupled to a power supply (e.g., VREAD voltage power supply) and is coupled to a common node of the transistors 252 and 256. The transistor 258 is activated by an active PSA signal (e.g., active low logic). An n-type field effect transistor 268 is configured to be coupled to a reference voltage (e.g., ground) and is coupled to a common node of the transistors 262 and 266. The transistor 268 is activated by an active NSA signal (e.g., active high logic).

In operation, the sense amplifier is activated by activating the PSA and NSA signals to couple the sense amplifier to the voltage of the power supply and the reference voltage. When activated, the sense amplifier compares the voltages of sense nodes A and B, and amplifies a voltage difference by driving the sense nodes A and B to complementary voltage levels. For example, the sense amplifier drives sense node A to the supply voltage; or vice versa. The sense amplifier may further drive the sense node B to a voltage that is complementary to the voltage of sense node A (e.g., sense node A driven to VCC and sense node B driven to ground; sense node A driven to ground and sense node B driven to VCC). When the sense nodes A and B have been driven to the complementary voltage levels, the states of sense nodes A and B are latched by the sense amplifier and remain latched until the sense amplifier is deactivated.

In various embodiments, the sense component 125 may optionally include driver 251 that can be a driver coupled to sense node B of FIG. 2. For example, with reference to FIG. 2, the driver 251 is separate from the driver 237 coupled to the digit line BL-COMP. Continuing in this example, drivers 251 and 237 may be configured to provide the same reference voltage. Driver 251 may be placed at the bottom of a vertically stacked memory array (e.g., formed as part of a CMOS under the array implementation described below later), while driver 237 may be placed at the top of a vertically stacked memory array. Accordingly, in the implementation of FIG. 2, sense node B is not connected to the digit line BL-COMP.

Figure 4:
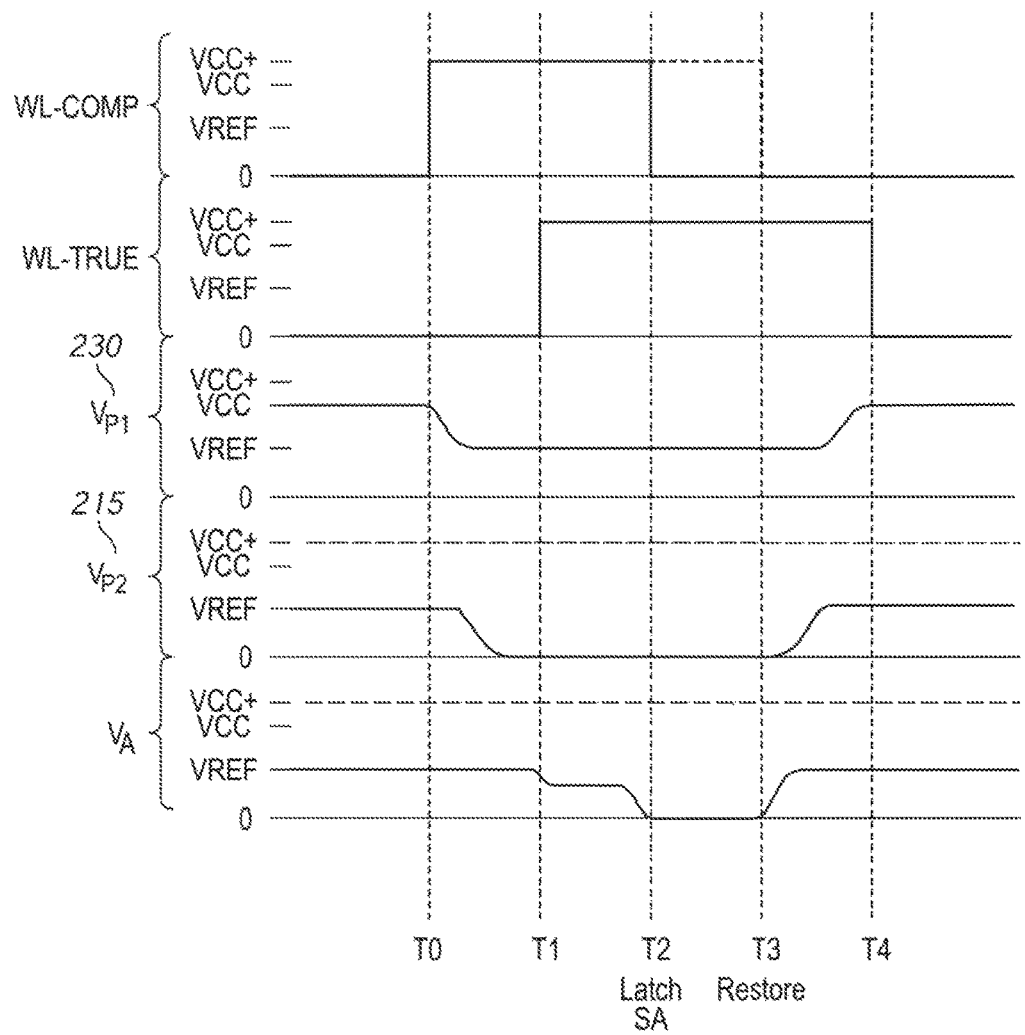
FIG. 4 is a timing diagram of various signals during a read operation for logic "1" data according to an embodiment of the disclosure.

FIG. 4 is a timing diagram of various signals during a read operation according to an embodiment of the disclosure. FIG. 4 will be described with reference to memory array 100 and example circuit 200 of FIGS. 1-3 respectively. The state stored by the memory cell 105 in the example read operation of FIG. 4 is a logic "1".

Prior to time T0, the digit lines BL-TRUE and BL-COMP (not depicted) are at an inactive voltage. For example, the drivers 235 and 237 precharge the digit lines BL-TRUE and BL-COMP digit lines to a reference voltage VREF. Accordingly, sense node A ($V_A$) of the sense component 125 is set to the voltage VREF of the precharged digit line BL-TRUE. Sense node B of the sense component 125 (not depicted in FIG. 3) is also set to the reference voltage VREF. The voltage at the first plate 230 ($V_{P1}$) has an initial voltage corresponding to the logic "1" state. As depicted in FIG. 3, that is the supply voltage VCC. The voltage at the second plate 215 ($V_{P2}$) has an initial voltage of the reference voltage VREF.

At time T0, the word line WL-COMP is activated to activate selection component 224 of a memory cell 105 being accessed. For example, WL-COMP is driven to a voltage higher than the supply voltage, VCC+, to activate the selection component 224. As a result, the digit line BL-COMP is coupled to first plate 230 of the capacitor 205. Thus the voltage of the first plate 230 changes from the supply voltage VCC to the reference voltage VREF as the driver 237 is continued to be activated to supply the reference voltage VREF to the bit line BL-COMP. The voltage decrease of the first plate 230 is coupled through the capacitor 205 to cause a voltage change at the second plate 215 as the select component 220 is still deactivated at this moment. For example, the voltage at the first plate 230 changes from the supply voltage VCC to the reference voltage VREF from time T0 to time T1 causing the voltage of the second plate 215 to change from time T0 to time T1. The magnitude of the change in voltage caused at the second plate 215 is based at least in part on the charge state initially stored by the capacitor 205. For example, if the capacitor 205 is charged with such an amount that corresponds a reference voltage VREF (that is ½ VCC), the voltage level of second plate 215 is changed approximately to the ground voltage.

Shortly after the voltage at first plate 230 begins to change, the second plate 215 changes responsive to the voltage change at the first plate 230. The second plate 215 is forced to preserve the change in voltage because the selection component 220 is not yet activated to couple the second plate 215 to the digit line BL-TRUE. For example, the voltage of the second plate 215 may change responsive to a time period that is associated with a voltage change of the first plate 230. As depicted, voltage at the first plate 230 first changes exponentially; then the voltage at the second plate 215 begins to change exponentially. The exponential change of the voltage can be based at least in part on the dielectric material of the capacitor 205 and/or the distance between the first plate 230 and the second plate 215. The second plate 215 may change proportionally to the voltage change at the first plate 230. In this example, with the state of the present example of FIG. 4 corresponding to a logic 1, the voltage at the second plate 215 due to the voltage change of the first plate 230 from the supply voltage VCC to the reference voltage VREF causes the second plate 215 to decrease by a proportional voltage. Thus the voltage at the second plate 215 decreases to below the reference voltage VREF.

At time T1, the word line WL-TRUE is activated to activate selection component 220 of a memory cell 105 being accessed, while deactivating the driver 235. For example, WL-TRUE is driven to a voltage higher than the supply voltage, VCC+, to activate the selection component 220. As a result, the digit line BL-TRUE is coupled to second plate 215. The voltage of the second plate 215 is coupled to the sense node A of the sense component 125 through selection component 220 over digit line BL-TRUE. The voltage at sense node A ($V_A$) changes responsive to the voltage at second plate 215, because the driver 235 is being deactivated. As depicted, the voltage at sense node A decreases to less than the reference voltage VREF (e.g., approaches ground).

Shortly before time T2, the sense component 125 (e.g., a sense amplifier) is activated to compare the voltage of sense node A (the voltage of the second plate 215 responsive to the change in the voltage at the first plate 230) with the voltage of sense node B that is set to the reference voltage VREF. Due to the voltage of sense node A being less than the voltage of the reference voltage VREF of sense node B, the sense component 125 drives sense node A to ground and sense node B to supply voltage VCC. Accordingly, the sense component 125 amplifies the change in voltage detected at second plate 215. The ground voltage at sense node A represents the logic 1 state read from the memory cell 105. The sense component 125 can latch that logical state. For example, while not shown in FIG. 4, the detected state of memory cell 105 may then be output through column decoder 130 and output 135 (FIG. 1). Accordingly, the sense component 125 detects the decrease in voltage at sense node A and thereby drives the voltage of digit line BL-TRUE to ground.

Having read the state at the first plate 230, the circuit 200 restores the initial state to the first plate 230. At time T2, the selection component 224 is deactivated with word line WL-COMP (e.g., driven to ground) to decouple the digit line BL-COMP from the first plate 230. As a result, the first plate 230 remains at the reference voltage VREF. If desired, the activation of the WL-COMP word line (and thus activation of select component 224) may be, prolonged until at Time 13 as shown by a dotted line. At time T3, driver 235 is activated again to drive the sense node A to the reference voltage VREF, resulting in driving the voltage of digit line BL-TRUE to the reference voltage VREF. At this time, as the selection component 224 is being deactivated, the change in voltage at the second plate 215 from the ground voltage to the reference voltage causes a voltage change at the first plate 230 from the reference voltage to the supply voltage VCC. Accordingly, the initial VCC charge can be restored to the first plate 230. In some embodiments, the driver 235 may drive the voltage of digit line BL-TRUE to a voltage higher than the supply voltage VCC, which may assist in driving the voltage at the first plate 230 to the supply voltage VCC if noises or interference exists in the capacitor 205.

At time T4, the selection component 220 is deactivated with word line WL-TRUE (e.g., driven to ground) to decouple the second plate 215 from the digit line BL-TRUE, and to complete the read operation. By decoupling the second plate 215 from digit line BL-TRUE, the voltage in the capacitor at the first plate 230 and second plate 215 is preserved until the next read or write operation for the memory cell 105.

In some embodiments, the timing of the signals may be different than that specifically shown in FIG. 4. Other signal timings may be used as well in other embodiments to couple the first plate 230 to the digit line BL-COMP to cause the voltage of the first plate 230 to change, which in turn causes a voltage change at the second plate 215 that is provided to the sense node A of the sense component 125.

Figure 5:
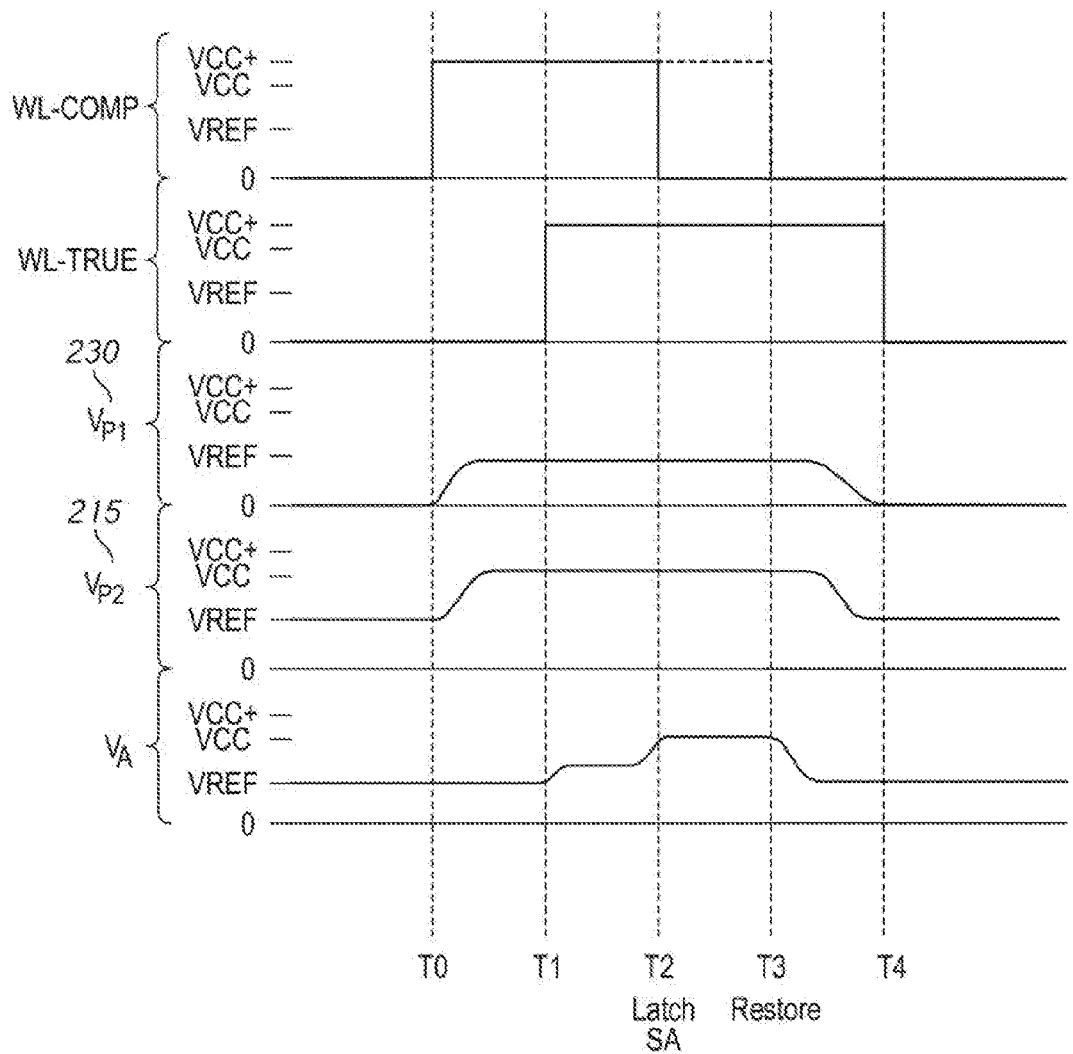
FIG. 5 is a timing diagram of various signals during a read operation for logic "0" data according to an embodiment of the disclosure.

FIG. 5 is a timing diagram of various signals during a read operation according to an embodiment of the disclosure. FIG. 5 will be described with reference to memory array 100 and example circuit 200 of FIGS. 1 and 2. The data state stored by the memory cell 105 in the example read operation of FIG. 5 is a logic "0".

Prior to time T0, the digit lines BL-TRUE and BL-COMP (not depicted) are at a reference voltage. For example, the drivers 235 and 237 precharge the digit lines BL-TRUE and BL-COMP digit lines to a reference voltage VREF. Accordingly, sense node A of the sense component 125 is set to the voltage VREF of the precharged digit line BL-TRUE. Sense node B of the sense component 125 is also set to the reference voltage VREF. The voltage at the first plate 230 ($V_{P1}$) has an initial charge corresponding to the logic "0" state. As depicted in FIG. 5, that is ground (e.g., 0V). The voltage at the second plate 215 ($V_{P2}$) has an initial charge of the reference voltage VREF.

At time T0, the word line WL-COMP is activated to activate selection component 224 of a memory cell 105 being accessed. For example, word line WL-COMP is driven to a voltage higher than the supply voltage, VCC+, to activate the selection component 224. As a result, the digit line BL-COMP is coupled to first plate 230 of the capacitor 205. Thus voltage of the first plate 230 changes from ground (e.g., 0V) to the reference voltage VREF. The voltage increase of the first plate 230 is coupled through the capacitor 205 to cause a voltage change at the second plate 215. For example, the voltage at the first plate 230 changes from the ground voltage 0V to the reference voltage VREF from time T0 to time T1 causing the voltage of the second plate 215 to change from time T0 to time T1. The magnitude of the change in voltage caused at the second plate 215 is based at least in part on the charge state initially stored by the capacitor 205.

Shortly after the voltage at first plate 230 begins to change, the second plate 215 changes responsive to the voltage change at the first plate 230. The second plate 215 is forced to preserve the change in voltage because the selection component 220 is not yet activated to couple the second plate 215 to the digit line BL-TRUE. For example, the voltage of the second plate 215 may change responsive to a time period that is associated with a voltage change of the first plate 230. As depicted, voltage at the first plate 230 first changes exponentially; then the voltage at the second plate 215 begins to change exponentially. The exponential change of the voltage can be based at least in part on the dielectric material of the capacitor 205 and/or the distance between the first plate 230 and the second plate 215. The second plate 215 may change proportionally to the voltage change at the first plate 230. In this example, with the state of the present example of FIG. 5 corresponding to a logic 0, the voltage at second plate 215 due to the voltage change of the first plate 230 from the ground voltage 0V to the reference voltage VREF causes the second plate 215 to increase by a proportional voltage. Thus the voltage at the second plate 215 increases to the supply voltage VCC.

At time T1, the word line WL-TRUE is activated to activate selection component 220 of a memory cell 105 being accessed. For example, word line WL-TRUE is driven to a voltage higher than the supply voltage, VCC+, to activate the selection component 220. As a result, the digit line BL-TRUE is coupled to second plate 215. The voltage of the second plate 215 is coupled to the sense node A of the sense component 125 through selection component 220 over digit line BL-TRUE. As the driver 235 is deactivated, the voltage at sense node A ($V_A$) changes responsive to the voltage at second plate 215. As depicted, the voltage at sense node A increases to more than the reference voltage VREF (e.g., approaches the supply voltage VCC).

Shortly before time T2, the sense component 125 (e.g., a sense amplifier) is activated to compare the voltage of sense node A (the voltage of the second plate 215 responsive to the change in the voltage at the first plate 230) with the voltage of sense node B that is set to the reference voltage VREF. Due to the voltage of sense node A being greater than the voltage of the reference voltage VREF of sense node B, the sense component 125 drives sense node A to the supply voltage VCC and sense node B to the ground. Accordingly, the sense component 125 amplifies the change in voltage detected at second plate 215. The supply voltage VCC at sense node A represents the logic 0 state read from the memory cell 105. The sense component 125 can latch that logical state. For example, the detected state of memory cell 105 may then be output through column decoder 130 and output 135 (FIG. 1). Accordingly, the sense component 125 detects the increase in voltage at sense node A and thereby drives the voltage of digit line BL-TRUE to the supply voltage.

Having read the state at the first plate 230, the circuit 200 restores the initial state to the first plate 230. At time T2, the selection component 224 is deactivated with word line WL-COMP (e.g., driven to ground) to decouple the digit line BL-COMP from the first plate 230. As a result, the first plate 230 remains at the reference voltage VREF. If desired, the activation of the WL-COMP word line (and thus activation of select component 224) may be prolonged until at Time T3 as shown by a dotted line. At time T3, driver 235 is activated again to drive the sense node A and thus the voltage of digit line BL-TRUE to reference voltage VREF. As a result, the coupled second plate 215 is also driven to reference voltage VREF. In turn, the change in voltage at the second plate 215 causes a voltage change at the first plate 230, which is no longer coupled to digit line BL-COMP. Accordingly, the initial ground charge may be restored to the first plate 230. In some embodiments, the driver 235 may drive the voltage of digit line BL-TRUE to a negative voltage (e.g., −VREF), which may assist in driving the voltage at the first plate 230 to ground if noises or interference exists in the capacitor 205.

At time T4, the selection component 220 is deactivated with word line WL-TRUE (e.g., driven to ground) to decouple second plate 215 from the digit line BL-TRUE, and to complete the read operation. By decoupling the second plate 215 from digit line BL-TRUE, the voltage in the capacitor at first plate 230 and second plate 215 is preserved until the next read or write operation for the memory cell 105

As described above in FIGS. 4 and 5, the voltage at the second plate 215 changes in response to the voltage change at the first plate 230 when the word line WL-COMP is activated. The initial voltage at the second plate 215 may be any voltage that can be stored at the capacitor 205 and changed responsive to the voltage change at the first plate 230. For example, FIGS. 4 and 5 describe that the initial voltage may be the reference voltage VREF. However, the voltage at the second plate may also be the supply voltage, ground, or a negative voltage (e.g., −VREF). The memory array 100 and example circuit 200 can be configured to operate with such voltages at the second plate 215 for the disclosed configurations and methods described herein, such as providing a reference voltage to the first plate 230 that changes the voltage across the capacitor 205.

The example voltages and signal timing described with reference to the read operations of FIGS. 3-4 have been provided for illustrative purposes, and are not intended to limit the scope of the present disclosure. It will be appreciated that the voltages and relative signal timing may be modified without departing from the scope of the present disclosure.

Figure 6:
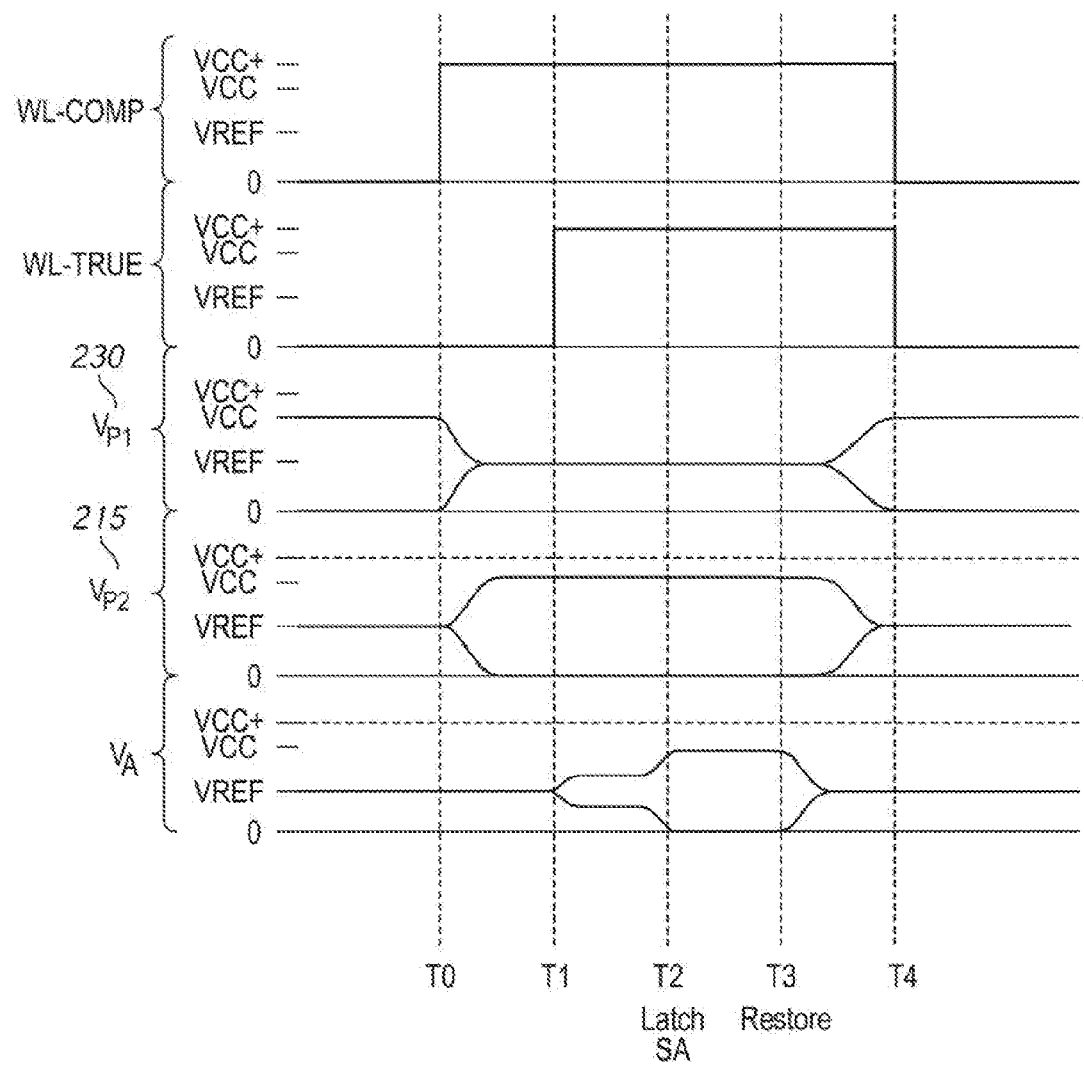
FIG. 6 is a timing diagram of various signals during a write operation according to an embodiment of the disclosure.

FIG. 6 is a timing diagram of various signals during a write operation according to an embodiment of the disclosure. It should be noted that FIG. 6 shows both of first initial state, in which a memory cell to be written stores initially logic "1", and second initial state, in which a memory cell to be written stores initially logic "0" and further shows both of first write state, in which new data of logic "1" is written, and second write sate, in which new data of logic "0" is written. The processes in write operation until Time T3 are the same as those of read operation except the word line WL-COMP is continued to be activated during a period between T2 and T3. If desired, however, the word line WL-COMP can be deactivated during that period.

At Time T3, the driver 235 is activated to supply the sense node A and the bit line BL-TRUE with the reference voltage VREF, and the driver 237 is also activated with activating the WL-COMP line (and thus selection component 224). The driver 237 thus drives the BL-COMP line with the supply voltage VCC in case of the data to be written is logic "1" and with the ground voltage in case of the data to be written is logic "0", as shown in FIG. 6. At time T4, both the WL-COMP and WL-TRUE are deactivated to complete write operation.

Figure 7:
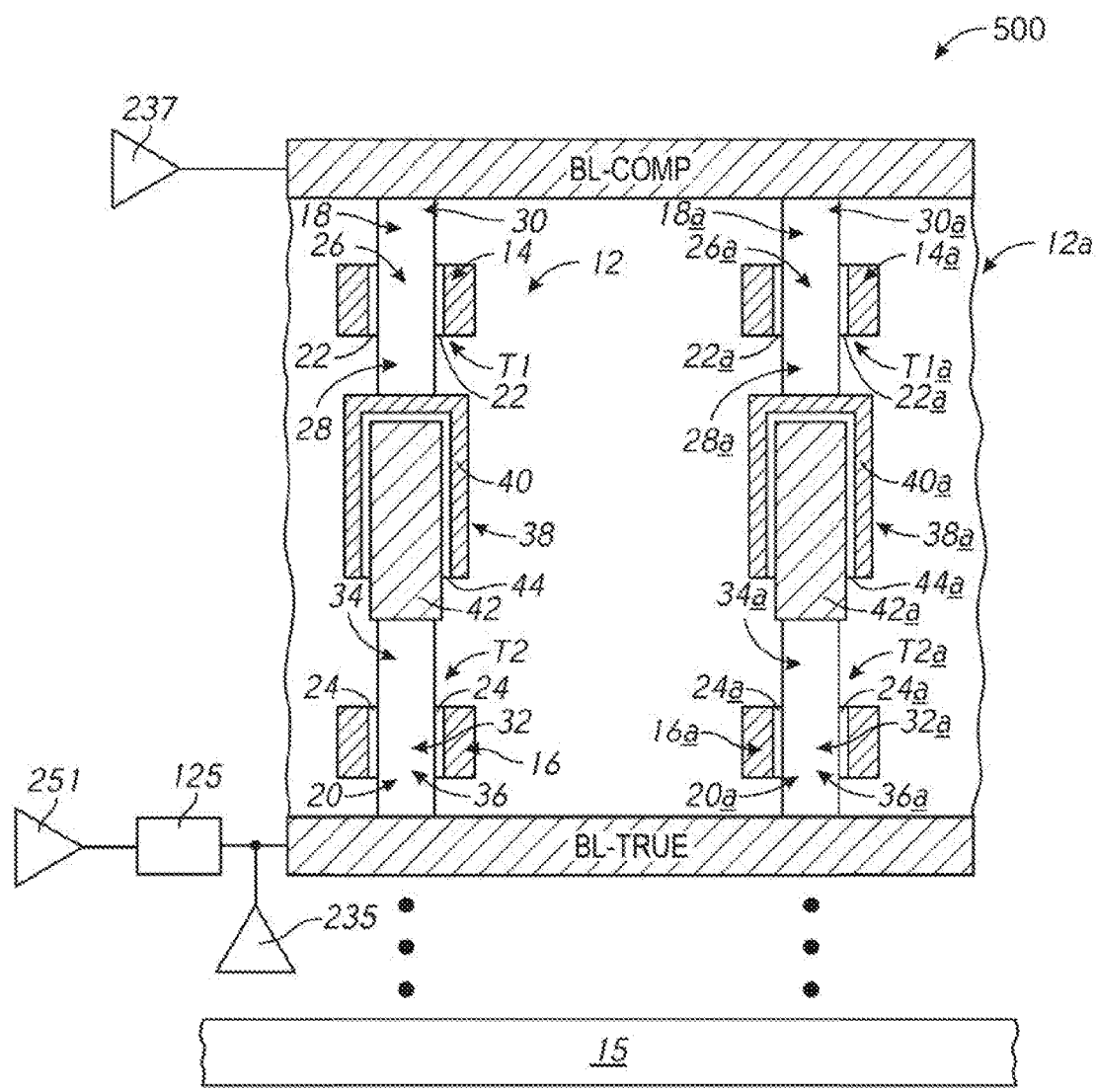
FIG. 7 is a diagram depicting a cross-sectional side view of a memory array showing an example configuration for vertically stacked memory cells according to an embodiment of the disclosure.

FIG. 7 is a diagram depicting a cross-sectional side view of a memory array showing an example configuration for vertically stacked memory cells. The illustrated region of memory array 500 comprises comparative digit lines BL-COMP and BL-TRUE, with such comparative bitlines being vertically offset relative to another and connected to various circuitries. Circuitries may include a sense component (e.g., a sense amplifier 125) and drivers 235 and 251 (FIGS. 2 and 3) which may be placed in the same layer as digit line BL-TRUE as well as driver 237 (FIG. 2) which may be placed in the same layer as digit line BL-COMP. In some embodiments, these circuitries may be between the digit line BL-TRUE and a semiconductor base 15 or may be incorporated into the semiconductor base 15. Although not shown, an interlayer insulating film intervenes between digit line BL-TRUE of the memory array 500 and the semiconductor base 15. In case where the circuitries 125, 235, 237 and 251 are incorporated or formed into the semiconductor base 15, a plurality of vias are formed in the interlayer insulating film to electrically connect word lines and digit lines of the array 500 to the circuitries.

A pair of adjacent memory cells 12 and 12a are shown, with such adjacent memory cells being in a common column as one another within the memory array (i.e., being along a common bitline, with such bitline being comprised by the comparative digit line BL-COMP and BL-TRUE in combination). In some embodiments the memory cells 12 and 12a may be referred to as substantially identical memory cells along a column of a memory array, with the term "substantially identical" meaning that the memory cells are identical to one another within reasonable tolerances of fabrication and measurement.

The memory cell 12 comprises transistors T1 and T2, with such transistors being along a first pair of wordlines WL-COMP and WL-TRUE. The adjacent memory cell 12a comprises transistors T1a and T2a, with such transistors being along a second pair of wordlines WL-COMP and WL-TRUE. A capacitor 38 is vertically between the transistors T1 and T2 of memory cell 12, and a similar capacitor 38a is vertically between the transistors T1a and T2a of memory cell 12a.

The capacitors comprise first nodes 40/40a, second nodes 42/42a and capacitor dielectric materials 44/44a. Although the first nodes 40/40a are shown to be container-shaped and the second nodes 42/42a are shown to extend within such container shapes, in other embodiments the first and second nodes may have other configurations. For instance, the first and second nodes may have planar configurations. In the illustrated configuration the first nodes 40/40a may be referred to as outer nodes and the second nodes 42/42a may be referred to as inner nodes.

The semiconductor (for example, silicon) pillars 18/18a extend from comparative digit line BL-COMP to the outer nodes 40/40a of capacitors 38/38a, and the semiconductor (for example, silicon) pillars 20/20a extend from the comparative digit line BL-TRUE to the inner nodes 42/42a of capacitors 38/38a.

The transistors T1/T1a have first source/drain regions 28/28a extending to the outer nodes 40/40a of capacitors 38/38a, and have second source/drain regions 30/30a extending to the comparative digit line BL-COMP. The transistors T1/T1a also have channel regions 26/26a between the first and second source/drain regions. Gates 14/14a are along the channel regions and offset from the channel regions by gate dielectric materials 22/22a. The transistors T2/T2a have third source/drain regions 34/34a extending to the inner nodes 42/42a of capacitors 38/38a, and have fourth source/drain regions 36/36a extending to the comparative digit line BL-TRUE. The transistors T2/T2a also have channel regions 32/32a between the third and fourth source/drain regions. Gates 16/16a are along the channel regions and offset from the channel regions by gate dielectric materials 24/24a. Gates 14 and 16 serve as WL-COMP and WL-TRUE of the first pair of wordlines, respectively, and Gates 14a and 16a serves as WL-COMP and WL-TRUE of the second pair of wordlines, respectively.

The embodiment of FIG. 7 advantageously enables the transistors and capacitor of a 2T-1C memory cell to all be vertically stacked, which may enable the memory cells to be packed to high levels of integration.

Figure 8:
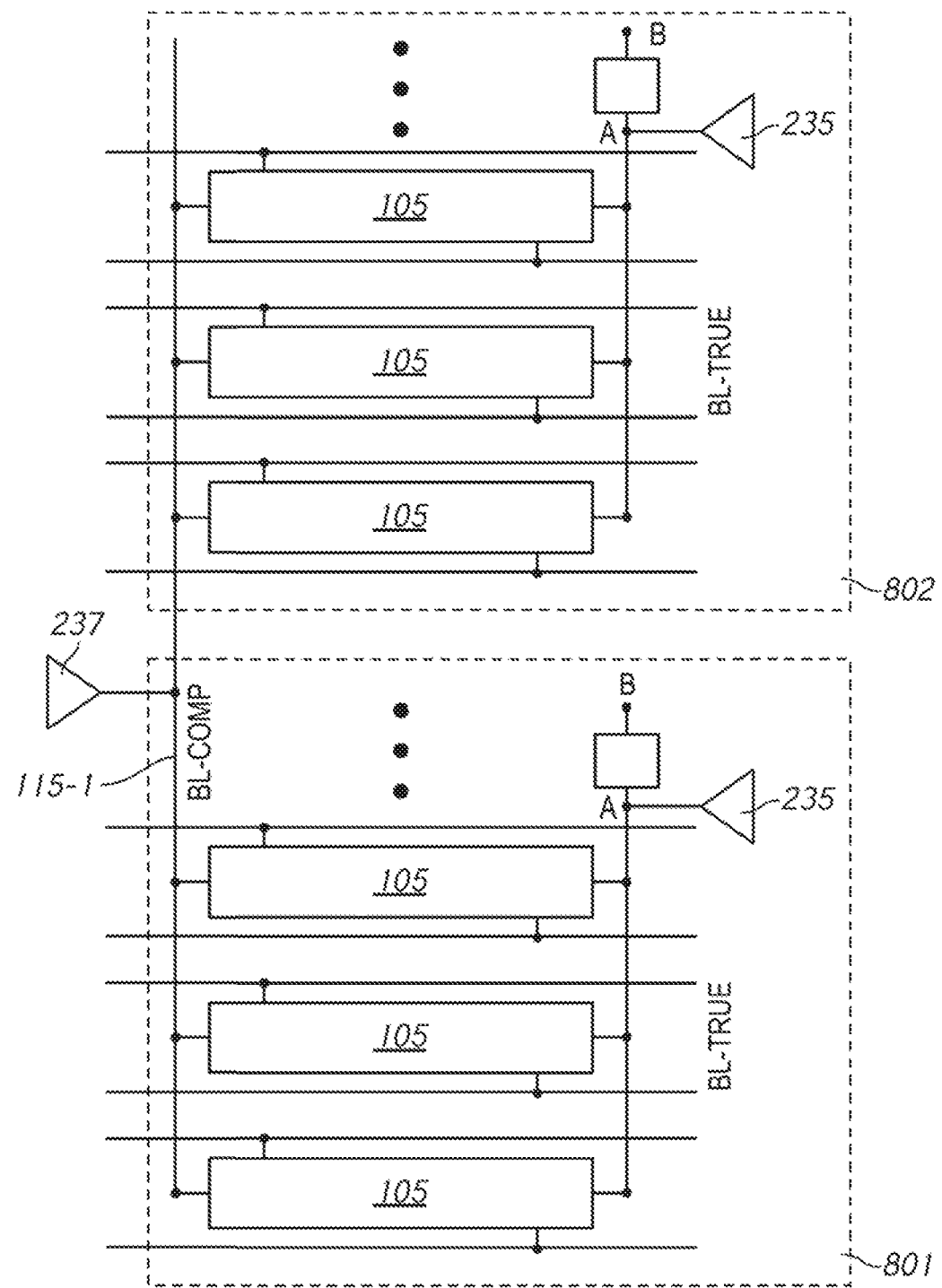
FIG. 8 illustrates an example memory array that supports vertically stacked memory cells in accordance with an embodiment of the present disclosure.

As has been discussed with reference to FIGS. 2-6, data is read out of from a selected memory cell through the BL-TRUE digit line and data is written into a selected memory cell through the BL-COMP digit line write data signal. Accordingly, the BL-COMP digit line can be shared with a plurality of column blocks of memory array as shown in FIG. 8, if these column blocks are subject to data read and write operations exclusively. In FIG. 8, the BL-COMP digit line of column block 801 is elongated over one or more other column blocks 802 to serve as its or their BL-COMPs. Further, the driver 237 (FIG. 2) is used in common for those column blocks. Other components are the same as those shown in FIG. 2 and are thus indicated by the same reference numerals to omit their further descriptions.

Figure 9:
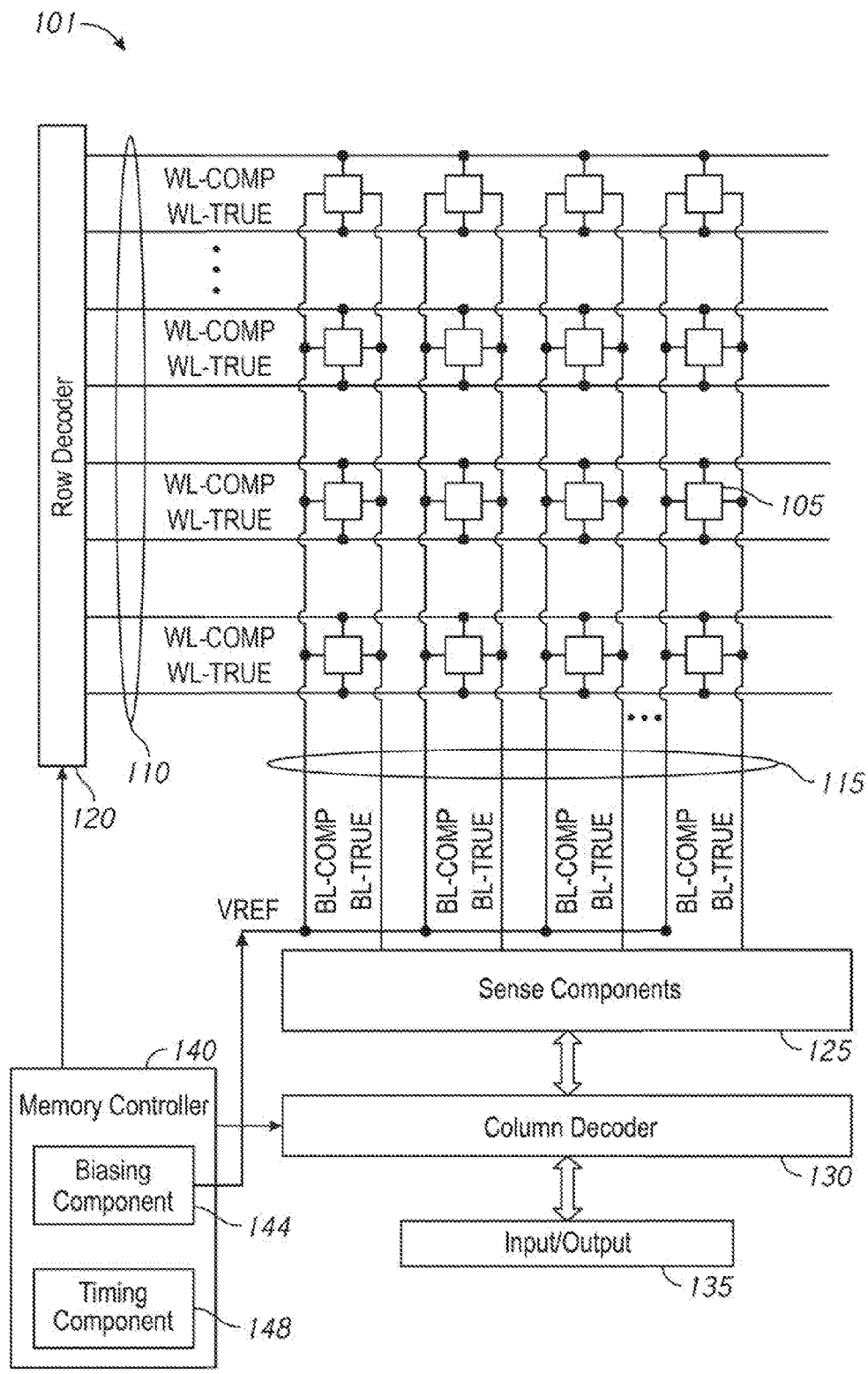
FIG. 9 illustrates an example memory array that supports vertically stacked memory cells in accordance with an embodiment of the present disclosure.

FIG. 9 illustrates an example memory array 101 that supports vertically stacked memory cells in accordance with an embodiment of the present disclosure. The same constituents as those of FIG. 1 are denoted by the same reference numerals to omit further descriptions thereof. In FIG. 9, the BL-COMP digit lines are coupled in common to each other to receive a bias voltage (a reference voltage VREF in this embodiment) from biasing component 144, differently from FIG. 1. The BL-COMP lines may be thus formed as a plate instead of forming them as individual stripe lines.

Figure 10:
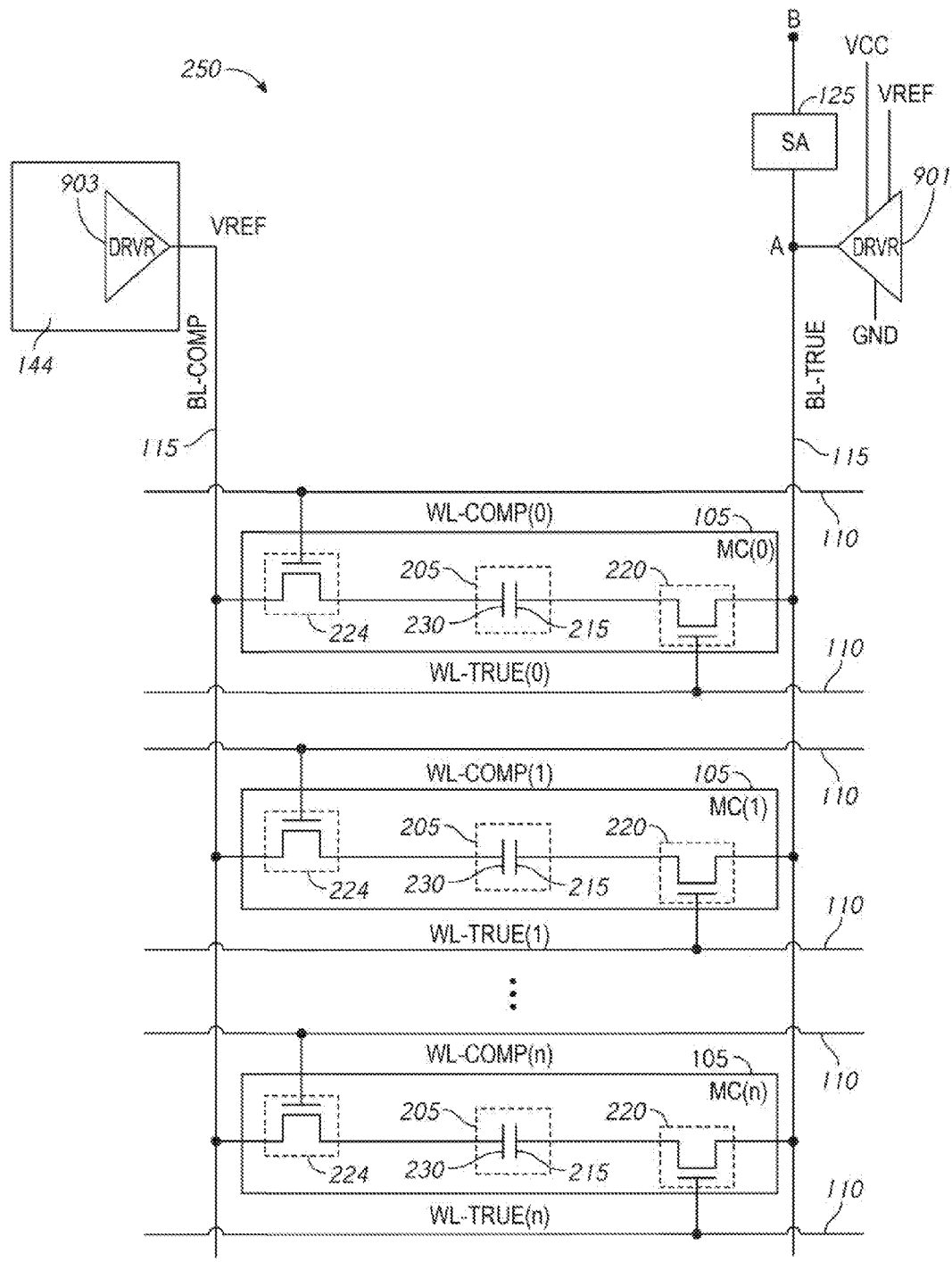
FIG. 10 is a schematic diagram of an example circuit that includes a column of memory cells according to an embodiment of the present disclosure.

FIG. 10 illustrates an example circuit 250 that includes a column of memory cells according to an embodiment of the disclosure, that may correspond to FIG. 9. In FIG. 10, the same constituents as those shown in FIG. 2 are denoted by the same reference numerals to omit their further descriptions. The BL-COMP digit line of the circuit 250 is coupled to driver 903 included in the biasing component 144 (FIG. 9) to receive the reference voltage VREF, differently from the circuit 200 of FIG. 2. The BL-TRUE digit line and the sense node A of the circuit 250 are coupled to driver 901 generating the supply voltage VCC, or the ground voltage, or the reference voltage VREF, differently further from the circuit 200 of FIG. 2.

Figure 11:
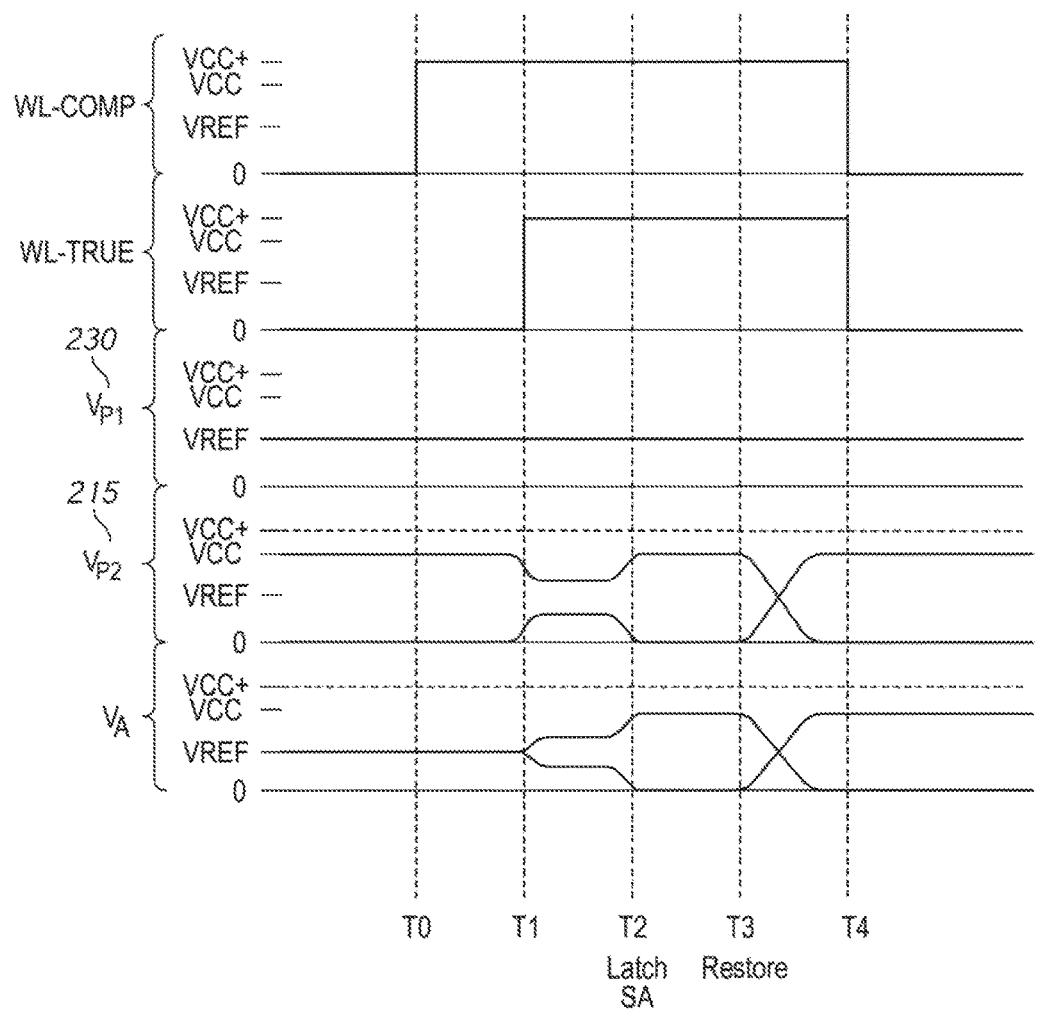
FIG. 11 is a timing diagram of various signals during read and write operations according to an embodiment of the disclosure.

With the configurations discussed with reference to FIGS. 9 and 10, read and write operations are performed in accordance with a timing diagram of various signals shown in FIG. 11.

Prior to time T0, the drivers 901 and 903 precharge the digit lines BL-TRUE and BL-COMP digit lines to a reference voltage VREF. Accordingly, sense node A ($V_A$) of the sense component 125 is set to the voltage VREF of the precharged digit line BL-TRUE. Sense node B of the sense component 125 (not depicted in FIG. 9) is also set to the reference voltage VREF. Although discussed in more detail later, the voltage at the first plate 230 ($V_{P1}$) of memory cell 105 has the reference voltage VREF irrespective of data stored therein. On the other hand, the second plate 215 ($V_{P2}$) of the memory cell 105 takes the supply voltage in case of storing logic "0" and the ground in case of storing logic "1".

At time T0, the word line WL-COMP is activated to activate selection component 224 of a memory cell 105 being accessed, while continuing to activate the driver 903. As a result, the digit line BL-COMP is coupled to first plate 230 of the capacitor 205. As the voltage on the BL-COMP line and the first plate 230 are the substantially same as each other, no change occurs substantially at the second plate 215.

At time T1, the word line WL-TRUE is activated to activate selection component 220 of a memory cell 105 being accessed, while deactivating the driver 901. As a result, the digit line BL-TRUE and the sense node A are coupled to second plate 215. The voltage of the second plate 215 is coupled to the sense node A of the sense component 125 through selection component 220 over digit line BL-TRUE. Because the sense node A ($V_A$) had been precharged at the reference voltage VREF, the voltage at the second plate 215 is decreased from the supply voltage VCC and the voltage at the sense node A is increased from the reference voltage VREF in case where the selected memory cell 105 stores the logic "1". In case where the selected memory cell stores logic "0", on the contrary, the voltage at the second plate 215 is increased from the ground and the voltage at the sense node A is decreased from the reference voltage VREF.

Shortly before time T2, the sense component 125 (e.g., a sense amplifier) is activated to compare the voltage of sense node A (the voltage of the second plate 215) with the voltage of sense node B that is set to the reference voltage VREF. Accordingly, the sense amplifier 125 changes the sense node A and the BL-TRUE digit line up to the supply voltage VCC in case of the logic "1" data, and up to the ground in case of the logic "0". Thus, the sense component 125 reads the data from the selected memory cell and restores it to the same.

In the data read operation, at time T3, the WL-COMP and WL-TRUE word lines are both deactivated to deactivate the select components 220 and 224. The read operation is thus completed.

In the data write operation, on the other hand, the driver 901 is activated again at time T3 to write new data into the selected memory cell. The driver 901 thus activated drives the BL-TRUE line to the supply voltage VCC in case of the new data being logic "1" or to the ground in case of the new data being logic "0". At time T4, the WL-COMP and WL-TRUE word lines are both deactivated to deactivate the select components 220 and 224. The write operation is thus completed.

Figure 12:
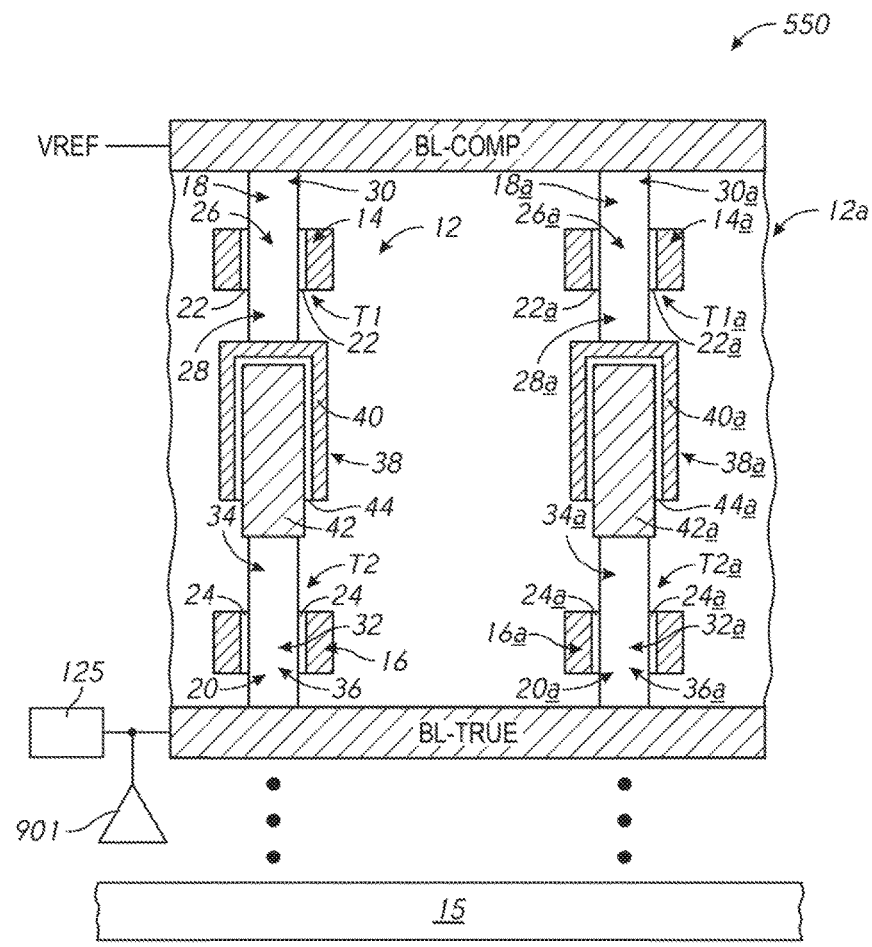
FIG. 12 is a diagram depicting a cross-sectional side view of a memory array showing an example configuration for vertically stacked memory cells according to an embodiment of the disclosure.

FIG. 12 is a diagram depicting a cross-sectional side view of a memory array 550 showing an example configuration for vertically stacked memory cells according to an embodiment of the disclosure, in which the same constituents as those of FIG. 7 are denoted by the same reference numerals to omit their further descriptions. As shown and discussed with reference to FIGS. 9 and 10, the BL-COMP digit line is provided with VREF. Because the BL-COMP digit line is free from supplied with variable voltage, this line is formed as a conductive plate that serves as a plurality of BL-COMP lines. On the other hand, the BL-TRUE line is coupled to the sense component 125 including the sense amplifier 125 and the driver 901.

The methods and system described with reference to FIGS. 9 to 12 may allow for very short length for each digitline BL-TRUE, resulting in reducing total digitline capacitance and thus increasing the voltage swing obtained from the cell capacitor during a cell charge share with the digitline.

Utilizing the methods and system described herein, further, FIG. 12 can include a driver that provides a reference voltage to digit line BL-COMP that eliminates the need for a vertical connection along the vertically stacked memory cells 12 and 12a. Accordingly, the configuration depicted in FIG. 12 may be utilized to couple the first plate to the digit line BL-COMP to provide a reference voltage to the first nodes 40/40a of the capacitor 38/38a, and cause a voltage change at the second nodes 42/42a of the capacitor 38/38a that is provided to a sense component 125 via the digit line BL-TRUE. The sense component may be formed in the semiconductor base 15 or between BL-TRUE line and the base 15.

Figure 13:
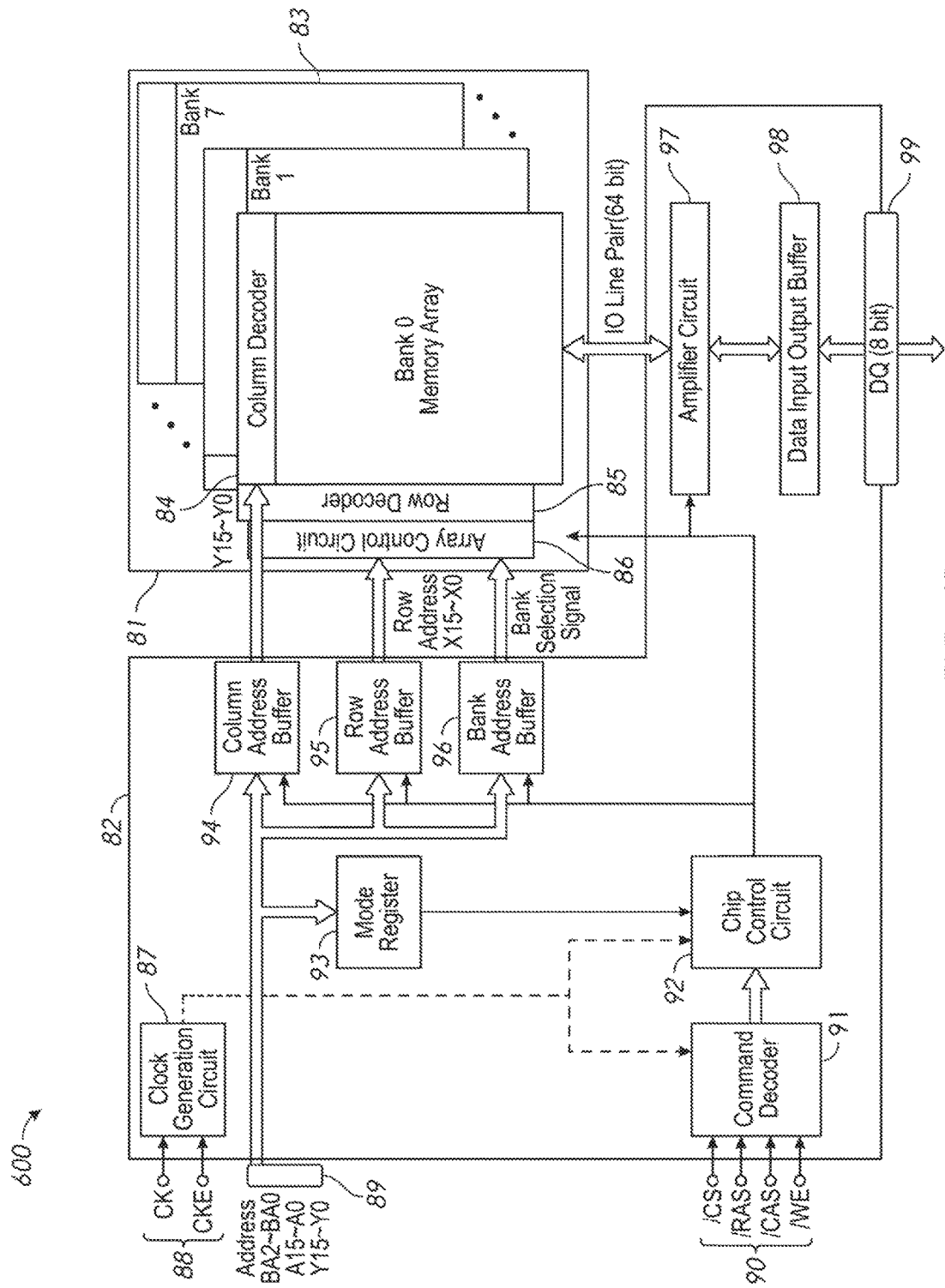
FIG. 13 is a block diagram of a memory chip in a memory system, in accordance with an embodiment of the present disclosure.

FIG. 13 is a block diagram of a memory chip in a memory system, in accordance with an embodiment of the present disclosure. The memory chip 600 may be DRAM or non-volatile RAM integrated into a single semiconductor chip, for example, however, other devices may also be the memory chip 600 of the present disclosure. The memory chip 600 may be mounted on a memory module substrate, a mother board or the like (not shown). The memory chip includes a memory cell array region 81 and a peripheral circuit region 82.

The memory cell array region 81 includes a memory cell array 83 including a plurality of banks, each bank including a plurality of word lines, a plurality of digit lines, and a plurality of memory cells arranged at intersections of the plurality of word lines and the plurality of digit lines. The memory cell array 83 may include memory cells as that previously described. For example, the memory cells of the memory cell array 83 may include two transistors and a capacitor as previously described with reference to FIGS. 2 and 7. The plurality of word lines and the plurality of digit lines may be as previously described, for example, word lines WL-COMP and WL-TRUE, and the digit lines BL- COMP and BL-TRUE. The selection of the digit line is performed by a plurality of column decoders 84 and the selection of the word line is performed by a plurality of row decoders 85. An array control circuit 86 is provided for selecting a hank of the memory cell array 83.

The peripheral circuit region 82 includes clock terminals 88, address terminals 89, command terminals 90, and data input/output (I/O) terminals (DQ) 99. For example, the data I/O terminals may handle eight-bit data communication. Data Input Output (I/O) buffers 98 are coupled to the data input/output terminals (DQ) 99 for data accesses, such as read accesses and write accesses of memories. The data accesses between the data I/O buffer 98 and the memory cell array 83 may be executed by an amplifier circuit 97. For example, the amplifier circuit may include the sense components 125 previously described in FIG. 1. Thus, the data is transferred between the amplifier circuit 97 and the data I/O buffer 98.

The address terminals 89 are supplied with address signals A15-A0, bank address signals BA0-BA2, and column address signals Y15-Y0. The address signals A15-A0, bank address signals BA0-BA2, and column address signals Y15 Y0 are provided to the mode register 93, column address buffer 84, row address buffer 95 and bank address buffer 96. The bank address signals may be used for selecting a bank among the plurality of banks. The bank address signals are provided to an array control circuit 86 for selecting a bank as a bank selection signal.

The command terminals 90 may include a chip select (/CS) pin for receiving a complementary CS signal, a row address strobe (/RAS) pin for receiving a RAS signal, a column address strobe (/CAS) pin for receiving a CAS signal, a write enable (/WE) pin for receiving a WE signal and the like. A command decoder 91 decodes command signals from the command terminals 90 to receive various commands including a read command and a write command, and provides control signals responsive to the received commands to a chip control circuit 92. The command decoder 91 and/or chip control circuit 92 may include the memory controller 140 previously described in FIG. 1, and control the operation of the memory circuits.

Accordingly, read data is read from a memory cell in the memory cell array 83 designated by a row address and a column address, when the read command is issued and the row address and the column address are timely supplied with the read command. The read data DQ is output from the data I/O terminals 99 via the amplifier circuit 97 and the data I/O buffer 98. Similarly, write data DQ is supplied to the data I/O terminals 99 via the data I/O buffer 98 and the amplifier circuit 97 to the memory cell array 83 and is written to the memory cell designated by a row address and a column address when the write command is issued and the row address and the column address are timely supplied with the write command.

The clock terminals 88 may include a clock pin CK and a clock enable (CKE) pin. An external clock signal CK can be supplied at the CK pin; and a clock enable (CKE) signal can be supplied at the CKE pin. The CKE signal may activate or deactivate internal clock circuits, input buffers and output drivers, thus the CKE signal is part of a command. The clock generator 87 receives the external clock signal CK and may execute phase control to generate an internal clock signal based on the received external clock signal and the CKE signal. Although not limited thereto, a DLL circuit can be used as the clock generator 87. The internal clock signal may be supplied various circuits, including the command decoder 91, the chip control circuit 92, the data I/O buffer 98, or the like. The various circuits may use the internal clock signal as a timing signal.

The structures and architectures described above may be incorporated into memory (e.g., DRAM, SRAM, etc.) and/or otherwise may be utilized in electronic systems. Such electronic systems may be any of a broad range of systems, such as, for example, clocks, televisions, cell phones, personal computers, automobiles, industrial control systems, aircraft, etc.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus comprising a first memory array and a plurality of first sense amplifiers,
wherein the first memory array comprises:
a plurality of first pairs of word lines, each of the plurality of first pairs of word lines including first and second word lines, the first and second word lines being configured to be driven independently of each other;
a plurality of first pairs of digit lines, each of the plurality of first pairs of digit lines including first and second digit lines, the first and second digit lines being configured to be driven independently of each other; and
a plurality of first memory cells, each of the first memory cells being coupled to an associated one of the plurality of first pairs of word lines and an associated one of the plurality of first pairs of digit lines, each of the first memory cells comprising first and second transistors and a first capacitor between the first and second transistors, the first and second transistors and the first capacitor being coupled in series between the first and second digit lines of the associated one of the plurality of first pairs of digit lines; and the first and second transistor having first and second gates, respectively, the first and second gates being coupled respectively to the first and second word lines of the associated one of the plurality of first pairs of word lines; and
wherein each of first sense amplifiers including first and second sense nodes, the first node being coupled to the first digit line of an associated one of the plurality of first pairs of digit lines, wherein the second digit lines of the plurality of first pairs of digit lines are coupled to each other.

2. The apparatus of claim 1, wherein the second sense node of each of the first sense amplifiers is supplied with a reference voltage to compare a voltage at the first sense node with the reference voltage.

3. The apparatus of claim 1, further comprising a semiconductor base and an insulating film over the semiconductor base, the first memory array being formed over the insulating film.

4. The apparatus of claim 3, wherein each of the first sense amplifiers is formed in the semiconductor base.

5. The apparatus of claim 3, wherein each of the first sense amplifier is formed between the memory array and the semiconductor base.

6. The apparatus of claim 1, further comprising a second memory array and a plurality of second sense amplifiers;
wherein the second memory array comprises:

a plurality of second pairs of word lines, each of the plurality of second pairs of word lines including third and fourth word lines, the third and fourth word lines being configured to be driven independently of each other;

a plurality of second pairs of digit lines, each of the plurality of second pairs of digit lines including third and fourth digit lines, the third and fourth digit lines being configured to be driven independently of each other; and a plurality of second memory cells, each of the second memory cells being coupled to an associated one of the plurality of second pairs of word lines and an associated one of the plurality of second pairs of digit lines, each of the second memory cells comprising third and fourth transistors and a second capacitor between the third and fourth transistors, the third and fourth transistors and the second capacitor being coupled in series between the third and fourth digit lines of the associated one of the plurality of second pairs of digit lines, and the third and fourth transistor having third and fourth gates, respectively, the third and fourth gates being coupled respectively to the third and fourth word lines of the associated one of the plurality of second of digit lines;

wherein each of second sense amplifiers including third and fourth sense nodes, the third node being coupled to the third digit line of an associated one of the plurality of second pairs of digit lines; and wherein the second digit line of each of the plurality of first pairs of digit lines is coupled to the fourth digit line of an associated one of the plurality of second pairs of digit lines.

7. The apparatus of claim 3, wherein the second sense node of each of the first sense amplifiers is supplied with a reference voltage to compare a voltage at the first sense node with the reference voltage, and wherein the fourth sense node of each of the second sense amplifiers is supplied with the reference voltage to compare a voltage at the third sense node with the reference voltage.

8. The apparatus of claim 1, wherein the first memory array comprises a conductive plate that serves as the second digit lines of the plurality of first pairs of digit lines.

* * * * *

UNITED STATES PATENT AND TRADEMARK OFFICE
CERTIFICATE OF CORRECTION

PATENT NO. : 10,127,972 B2  
APPLICATION NO. : 15/679042  
DATED : November 13, 2018  
INVENTOR(S) : Christopher J. Kawamura et al.

Page 1 of 1

It is certified that error appears in the above-identified patent and that said Letters Patent is hereby corrected as shown below:

In the Claims

| Column, Line | Reads | Should read |
|---|---|---|
| Column 20, Line 12 In Claim 7, | "The apparatus of claim 3, wherein the second sense node of each of the first sense amplifiers is supplied with a reference voltage to compare a voltage at the first sense node with the reference voltage, and wherein the fourth sense node of each of the second sense amplifiers is supplied, with the reference voltage to compare a voltage at the third sense node with the reference voltage." | -- The apparatus of claim 6, wherein the second sense node of each of the first sense amplifiers is supplied with a reference voltage to compare a voltage at the first sense node with the reference voltage, and wherein the fourth sense node of each of the second sense amplifiers is supplied with the reference voltage to compare a voltage at the third sense node with the reference voltage. -- |

Signed and Sealed this  
Third Day of September, 2019

Andrei Iancu  
*Director of the United States Patent and Trademark Office*